United States Patent
Kabe et al.

(10) Patent No.: US 8,034,179 B2
(45) Date of Patent: Oct. 11, 2011

(54) METHOD FOR INSULATING FILM FORMATION, STORAGE MEDIUM FROM WHICH INFORMATION IS READABLE WITH COMPUTER, AND PROCESSING SYSTEM

(75) Inventors: Yoshiro Kabe, Amagasaki (JP); Junichi Kitagawa, Amagasaki (JP); Kikuo Yamabe, Tsukuba (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 12/865,969

(22) PCT Filed: Feb. 6, 2009

(86) PCT No.: PCT/JP2009/052447
§ 371 (c)(1),
(2), (4) Date: Oct. 29, 2010

(87) PCT Pub. No.: WO2009/099254
PCT Pub. Date: Aug. 13, 2009

(65) Prior Publication Data
US 2011/0039418 A1     Feb. 17, 2011

(30) Foreign Application Priority Data

Feb. 8, 2008   (JP) ................ 2008-029476
Feb. 8, 2008   (JP) ................ 2008-029477

(51) Int. Cl.
*H01L 21/31*   (2006.01)
*H01L 21/469*  (2006.01)
(52) U.S. Cl. ............... 118/719; 438/761; 438/762

(58) Field of Classification Search ............... 118/719; 438/761, 762; 257/E21.24
See application file for complete search history.

(56) References Cited

U.S. PATENT DOCUMENTS

2005/0136610 A1   6/2005 Kitagawa et al.
2006/0192248 A1*  8/2006 Wang ...................... 257/324

FOREIGN PATENT DOCUMENTS

| CN | 101010787 A | 8/2007 |
| EP | 1786030 A1  | 5/2007 |
| JP | 4-43642 A   | 2/1992 |

(Continued)

OTHER PUBLICATIONS

International Search Report for International Application No. PCT/JP2009/052447 mailed May 19, 2009 with English translation.

*Primary Examiner* — William M. Brewster
(74) *Attorney, Agent, or Firm* — Harry K. Ahn; Abelman Frayne & Schwab

(57) ABSTRACT

In order to form an insulating film, which constitutes a flat interface with silicon, by CVD, a surface of silicon is oxidized to form a silicon oxide film using a plasma treatment apparatus in which microwaves are introduced into a chamber through a flat antenna having a plurality of holes. A silicon oxide film is formed as an insulating film on the silicon oxide film by CVD. Further, in the plasma treatment apparatus, a treating gas containing a noble gas and oxygen is introduced into the chamber, and, further, microwaves are introduced into the chamber through the flat antenna. Plasma is generated under a pressure in the range of not less than 6.7 Pa and not more than 533 Pa to modify the insulating film with the plasma.

17 Claims, 18 Drawing Sheets

FOREIGN PATENT DOCUMENTS

| | | |
|---|---|---|
| JP | 9-181072 A | 7/1997 |
| JP | 11-67747 A | 3/1999 |
| KR | 10-2007-0047769 A | 5/2007 |
| KR | 10-2007-0095989 A | 10/2007 |
| TW | 235433 B | 7/2005 |
| WO | 01/69665 A1 | 9/2001 |
| WO | 02/059956 A1 | 8/2002 |
| WO | 2004/008519 A1 | 1/2004 |
| WO | 2006/025363 A1 | 3/2006 |

* cited by examiner plasma oxidation process

CVD process plasma modifying process

METHOD FOR INSULATING FILM FORMATION, STORAGE MEDIUM FROM WHICH INFORMATION IS READABLE WITH COMPUTER, AND PROCESSING SYSTEM

CROSS REFERENCE TO RELATED APPLICATION

This is a U.S. national stage application of International Application No. PCT/JP2009/052447, filed on 6 Feb. 2009. Priority under 35 U.S.C. §119(a) and 35 U.S.C. §365(b) is claimed from Japanese Application No. JP2008-029476 and JP2008-029477, both filed 8 Feb. 2008, the disclosure of each of which are also incorporated herein by reference.

FIELD OF INVENTION

The present invention relates to a method, a computer readable recording medium and processing system for forming an insulating film using a CVD (Chemical Vapor Deposition) method.

BACKGROUND OF THE INVENTION

A CVD process is widely used for forming an insulating film such as a silicon oxide film, a high dielectric constant insulating film or the like in a manufacturing process for various kinds of semiconductor devices. The CVD process forms the insulating film on an object to be processed by vaporizing a raw material using an energy such as heat and the like.

The following problems have been noted when forming an insulating film using the CVD process. The first problem is that an interface-level density becomes higher because microscopic asperity portions are formed on the interface between the insulating film and an underlying layer deposited by the CVD process. If the interface-level density becomes higher, for example, there is concern that the mobility of carriers moving at the interface between the silicon layer and the insulating film becomes lower and electrical performance of a device is deteriorated when the underlying layer is a silicon layer. Also, since the film thickness varies according to the asperity portions, there exist microscopically weak portions, thereby affecting the lifetime of insulation breakdown.

Also, the second problem is that an insulating film (e.g. a silicon oxide film) formed using a CVD process or a plasma CVD process does not have a good film quality, because the insulating film includes many dangling bonds and impurities such as moisture, chlorine or the like derived from the raw material. As a result, the film quality is needed to be improved by annealing the insulating film formed by the CVD process or the plasma CVD process at a high temperature, for example, of above 700° C. But, it is hard to improve the fundamental film quality by the annealing process after forming the film, because it is impossible to recombine Si—O bonds by supplying thermal energy. Also, although processing at a high temperature is necessary to improve the modification effect, an annealing process at a high temperature requires an increased thermal budget, making it hard to control the distribution of impurities dispersed in a silicon layer, and accordingly giving an undesirable effect to the quality of semiconductor devices.

Also, for example, when using a synthetic resin substrate or a glass substrate such as in the liquid crystal display or organic electroluminescent display, it is impossible to perform the annealing process at a high temperature for modifying an insulating film.

Accordingly, a technique has been proposed for modifying the film quality at a relatively low temperature by processing a silicon oxide film with plasma. See, for example, WO 2002/059956 and WO 2001/69665.

CONTENTS OF THE INVENTION

Problems to be Solved

A modifying process that processes and modifies an insulating film formed by a CVD process using plasma of noble gas and oxygen gas, as described in WO 2002/059956 and WO 2001/69665, is an excellent technique in that it can decrease thermal budget and form an insulating film with a good quality. However, it is impossible to flatten the interface between the silicon and the insulating film even if the modifying process is performed with plasma. That is, when forming an insulating film on silicon using a CVD process, silicon is oxidized by heat at first, and thereby a silicon oxide film is formed. In such process of forming a silicon oxide film, the silicon oxide film is formed with a concave/convex pattern because an oxidation rate in (100) plane of silicon is microscopically different from an oxidation rate in (111) plane of the silicon. Also, the shape of the interface is not changed although the insulating film is deposited on a silicon oxide film using a CVD process. Accordingly, although an insulating film is modified according to the method described in WO 2002/059956 and WO 2001/69665, the interface is not flattened and the concave/convex pattern is not improved. That is, it can be hardly expected that the modifying process with plasma will have an effect on the first problem.

Means to Solve the Problem

An object of the present invention, that has been made in view of the above-mentioned problems, is to provide a method for forming an insulating film that can flatten the shape of the interface between silicon and an insulating film as flat as possible.

To solve the problems, the present invention provides a method for forming an insulating film that includes steps of oxidizing silicon exposed on a surface of an object to be processed with plasma to form a silicon oxide film as a first insulating film, forming a second insulating film on the silicon oxide film using a CVD process, and modifying the second insulating film using plasma of a process gas containing oxygen.

The oxidizing step may be conducted with a plasma processing apparatus that introduces microwave to a process chamber via a plane antenna having a plurality of holes, and the plasma processing apparatus may preferably have a process pressure in the range of 6.7 Pa and 267 Pa, and the flow rate ratio of oxygen over an entire process gas may range from 0.1% to 30%. The process pressure in the oxidizing step may desirably ranges from 6.7 Pa to 67 Pa.

The modifying step may be conducted at a process pressure range of 6.7 Pa and 267 Pa, and the flow rate ratio of oxygen over an entire process gas may range from 0.1% to 30%. The process pressure of the modifying step may desirably range from 6.7 Pa to 67 Pa. The modifying step may be conducted by a plasma processing apparatus that introduces microwave to a process chamber with a plane antenna having a plurality of holes. Also, the second insulating film may be formed by a plasma CVD or a thermal CVD. Also, each of the forming step and the modifying step may be repeatedly performed. The process temperature of the oxidizing step and the modifying step may range from 200° C. to 600° C. Also, the oxidizing step and the modifying step may be conducted in the same process chamber. Also, the interface between the silicon oxide film and silicon may be flat. Also, the first insulating film may have a film thickness in the range of 3 nm and 10 nm, and the second insulating film may have a film thickness in the range of 3 nm and 10 nm. Also, the second insulating film may be a silicon oxide film deposited by a CVD process using dichloro-silane and $N_2O$ as a raw material gas.

The present invention also provides a computer readable medium storing a control program that, when executed, causes a computer to perform a method for forming an insulating film using a process system having a plurality of process chambers for conducting a predetermined process for an object to be processed. The method comprises oxidizing silicon exposed on a surface of an object to be processed with plasma to form a silicon oxide film as a first insulating film, forming a second insulating film on the silicon oxide film by a CVD process, and modifying the second insulating film using plasma of a process gas containing oxygen.

The present invention further provides a processing system having a plurality of process chambers each controlled by a control unit. The processing system comprises a first process chamber configured to oxidize silicon exposed on a surface of an object with plasma to form a silicon oxide film as a first insulating film, a second process chamber configured to form a second insulating film on the silicon oxide film using a CVD process, and a third process chamber configured to modify the second insulating film using plasma of a process gas containing oxygen. The first process chamber and the third process chamber may preferably be the same process chamber.

Effect of the Invention

The present invention can suppress an increase of the interface-level density by the accumulation of fixed charges in the vicinity of the interface between the silicon and the insulating film, by oxidizing the silicon surface with plasma prior to the CVD process to form a silicon oxide film as a first insulating film such that the interface between the first insulating film and silicon becomes even, and by forming a second insulating film on the silicon oxide film using the CVD process. Also, the present invention can make the film quality of the second insulating film dense and to have less impurities and dangling bonds, by modifying the second insulating film using plasma. Accordingly, the present invention can secure the mobility of carriers in the vicinity of the interface between the silicon and the insulating film, improve electrical characteristics of devices, e.g., working speed of transistors, and manufacture devices with high reliability due to the improvement of film quality.

DETAILED DESCRIPTION OF SEVERAL EMBODIMENTS

First Embodiment

Figure 1:
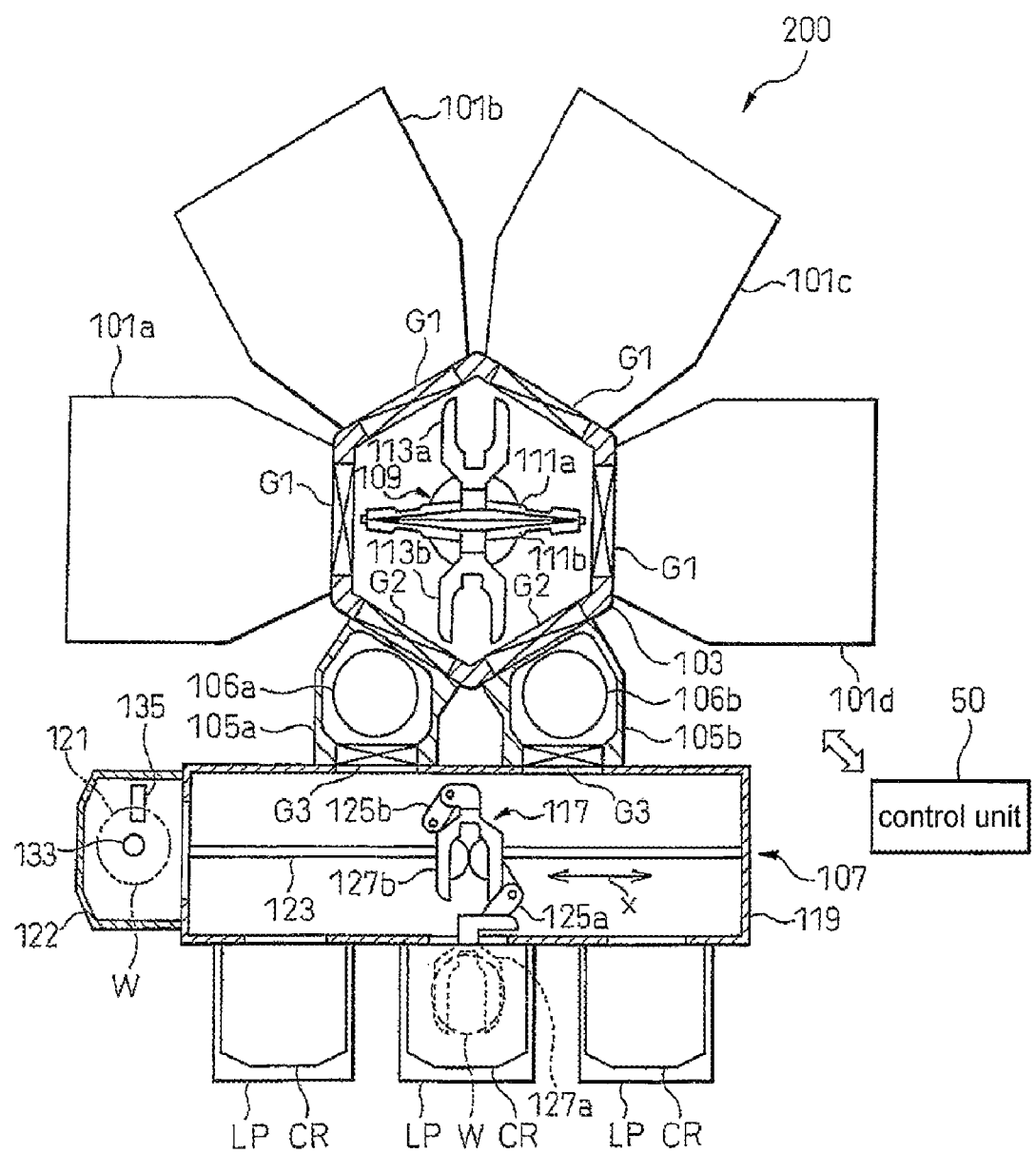
FIG. 1 is a plan view illustrating a schematic constitution of a substrate processing system.

Hereinafter, exemplary embodiments of the present invention will be described with reference to the accompanying drawings. First, referring to FIG. 1, a substrate processing system in which the method for forming an insulating film according to an exemplary embodiment of the present invention is performed is described. FIG. 1 is a view showing a schematic constitution of a substrate processing system 200 configured to perform a variety of processes such as a plasma oxidation process, a film forming process, a modifying process and so forth, for e.g. a semiconductor wafer W (which will be simply referred to as "wafer") as a substrate. Substrate processing system 200 is constituted as cluster tools with a multi-chamber structure.

Substrate processing system 200 comprises, as main components, four process modules 101a, 101b, 101c, 101d for performing various processes for wafer W, a vacuum-side transfer chamber 103 connected to process modules 101a, 101b, 101c, 101d through a gate valve G1, two load-lock chambers 105a and 105b connected to transfer chamber 130 through a gate valve G2, and a loader unit 107 connected to two load-lock chambers 105a and 105b through a gate valve G3.

Four process modules 101a~101d are processing apparatus for performing e.g. a plasma oxidization process, a CVD process, a plasma modifying process, or the like for wafer W. Process modules 101a~101d may perform the same process for wafer W, or may perform different processes for wafer W. In the present embodiment, process modules 101a~101d are configured to perform at least a plasma oxidation process for oxidizing silicon of wafer W to form a silicon oxide film, a film forming process by a CVD method and a plasma modifying process for modifying the silicon oxide film formed by the film forming process, with plasma.

A transfer apparatus 109 is disposed in a vacuum-side transfer chamber 103 as a first substrate transfer apparatus for transferring wafer W with respect to process modules 101a through 101d or load-lock chambers 105a and 105b. Vacuum-side transfer chamber 103 is configured to be vacuum-exhausted. Transfer apparatus 109 includes a pair of transfer arms 111a and 111b arranged to face each other. Respective transfer arms 111a and 111b are configured to be bendable, extendable and rotatable along the same rotating shaft. Moreover, forks 113a and 113b are provided respectively for arranging and supporting wafer W provided in the front ends of respective transfer arms 111a, 111b. Transfer apparatus 109 transfers wafer W between process modules 101a through 101d or between process modules 101a through 101d and load-lock chambers 105a and 105b in a state where wafer W is arranged on forks 113a and 113b.

Placing tables 106a and 106b are provided in load-lock chambers 105a and 105b to arrange wafer W. Load-lock chambers 105a and 105b are configured to be converted between a vacuum state and an atmosphere opening state. Wafers W are exchanged between vacuum-side transfer chamber 103 and an atmosphere-side transfer chamber 119 (described below) via the interposition of placing tables 106a and 106b of load-lock chambers 105a, 105b.

Loader unit 107 includes an atmosphere-side transfer unit 119 provided with a transfer apparatus 117 working as a second substrate transfer apparatus for transferring wafer W, three load ports LP arranged adjacent to atmosphere-side transfer unit 119, and a chamber 112 having a position detecting apparatus (orientor; 121) arranged at the other side of atmosphere-side transfer unit 119 to measure a position of wafer W.

Atmosphere-side transfer unit (119), for example, is equipped with a circulation facility (not shown) configured to form a clean environment by down-flowing nitrogen gas or clean air, thereby maintaining a clean environment. Atmosphere-side transfer unit 119 is formed with a rectangular shape when viewed from a plain and is provided with a guide rail 123 along with the longitudinal direction. Guide rail 123 supports transfer apparatus 117 so that transfer apparatus 117 can be slide-movable thereon. That is, transfer apparatus 117 is configured to be movable in the X direction along with guide rail 123 by a driving device (not shown). Transfer apparatus 117 includes a pair of transfer arms 125a and 125b arranged in two-stages of up and down. The respective transfer arms 125a and 125b are configured to be bendable, extendable, and rotatable. Forks 127a and 127b are provided respectively in the front ends of respective transfer arms 125a and 125b working as a holding member for arranging and holding wafer W. Transfer apparatus 117 transfers wafer W between a wafer cassette CR of load port LP, load-lock chambers 105a and 105b, and position detecting apparatus 121.

Load port LP is configured to arrange wafer cassette CR, and wafer cassette CR is configured in such a way that a plurality of wafers are arranged and accommodated at the same intervals in multi-stages. Position detecting apparatus 121 includes a rotary plate 133 rotated by a drive motor (not shown), and an optical sensor 135 installed in a circumferential position of rotary plate 133 for detecting the circumference of the edge of wafer W.

Wafer processing system 200 constituted as described above performs a plasma oxidation process, a CVD process and a plasma modifying process for wafer W in the following order. First, a sheet of wafer W is carried out of wafer cassette CR of load port LP using fork 127 of transfer apparatus 117 in atmosphere-side transfer chamber 119, aligned by position detecting apparatus 121, and then carried into load-lock chamber 105a or 105b. In load-lock chamber 105a or 105b where wafer W is arranged on placing table 106a or 106b, gate valve G3 is closed so load-lock chamber 106a or 106b is depressurized and exhausted to be a vacuum state inside thereof. Thereafter, gate valve G2 is opened and wafer W is carried out of load-lock chamber 105a or 105b by fork 113 of transfer apparatus 109 in vacuum-side transfer chamber 103 and then carried into one of process modules 101a through 101d.

In the present embodiment, for example, process module 101a is configured to perform a plasma oxidation process for oxidizing silicon on the surface of wafer W. Also, process modules 101b, 101c are configured to perform a CVD process for forming an insulating film, e.g. a silicon oxide film on wafer W. Also, process module 101d is configured to perform a plasma modifying process for modifying the insulating film after forming the insulating film. Also, process modules 101a and 101d may be configured to perform both the plasma oxidation process and the plasma modifying process, respectively.

Wafer W carried out of load-lock chamber 105a or 105b by transfer apparatus 109 is carried into process module 101a at first, and thereafter, gate valve G1 is closed to perform a plasma oxidation process for wafer W.

Successively, gate valve G1 is opened and wafer W with a silicon oxide film formed thereon is carried into one of process modules 101b or 101c from process module 101a by transfer apparatus 109 in a vacuum state. Then, a CVD process is performed for wafer W using a film forming gas after gate valve G1 is closed. As a result, an insulating film is deposited on the silicon oxide film by the CVD process.

Successively, gate valve G1 is opened and wafer W formed with an insulating film by the CVD process is carried into a process module 101d in a vacuum state from process module 101b or 101c by transfer apparatus 109. Then, a plasma modifying process is performed for the insulating film after gate valve G1 is closed. Next, gate valve G1 of process module 101d is opened so wafer W processed with the plasma modifying process is carried out by transfer apparatus 109 and then carried into load-lock chamber 105a or 105b. Thereafter, wafer W completed with the processes is deposited in wafer cassette CR of load port LP in a reverse order to the above so a process for one sheet of wafer W is completed in substrate processing system 200. Also, the respective processing apparatuses in substrate processing system 200 may be constituted of any arrangements as long as the apparatus can perform the processes effectively. Moreover, if it can process effectively, the number of process modules in substrate processing system 200 may not be limited to four and may be more than five.

Figure 2:
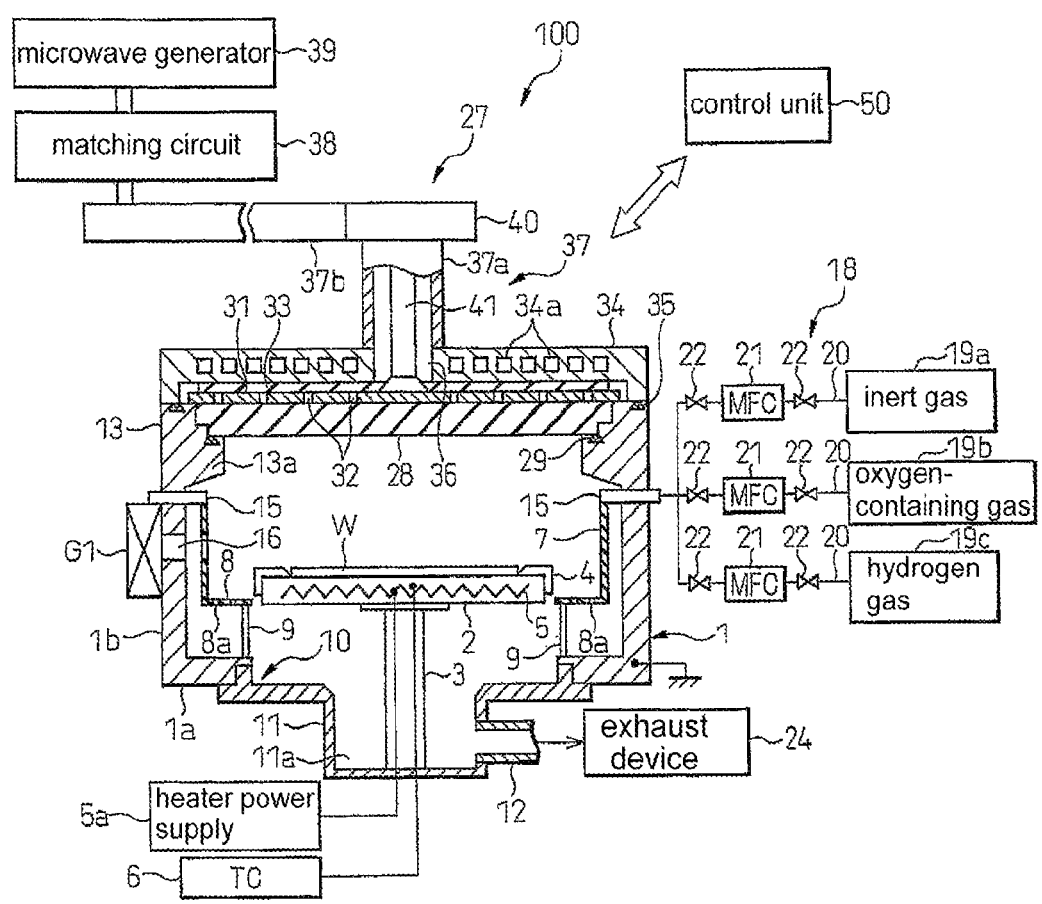
FIG. 2 is a schematic cross-sectional view illustrating one exemplary embodiment of a plasma processing apparatus suitable to perform a method for forming an insulating film according to the present invention.
Figure 3:
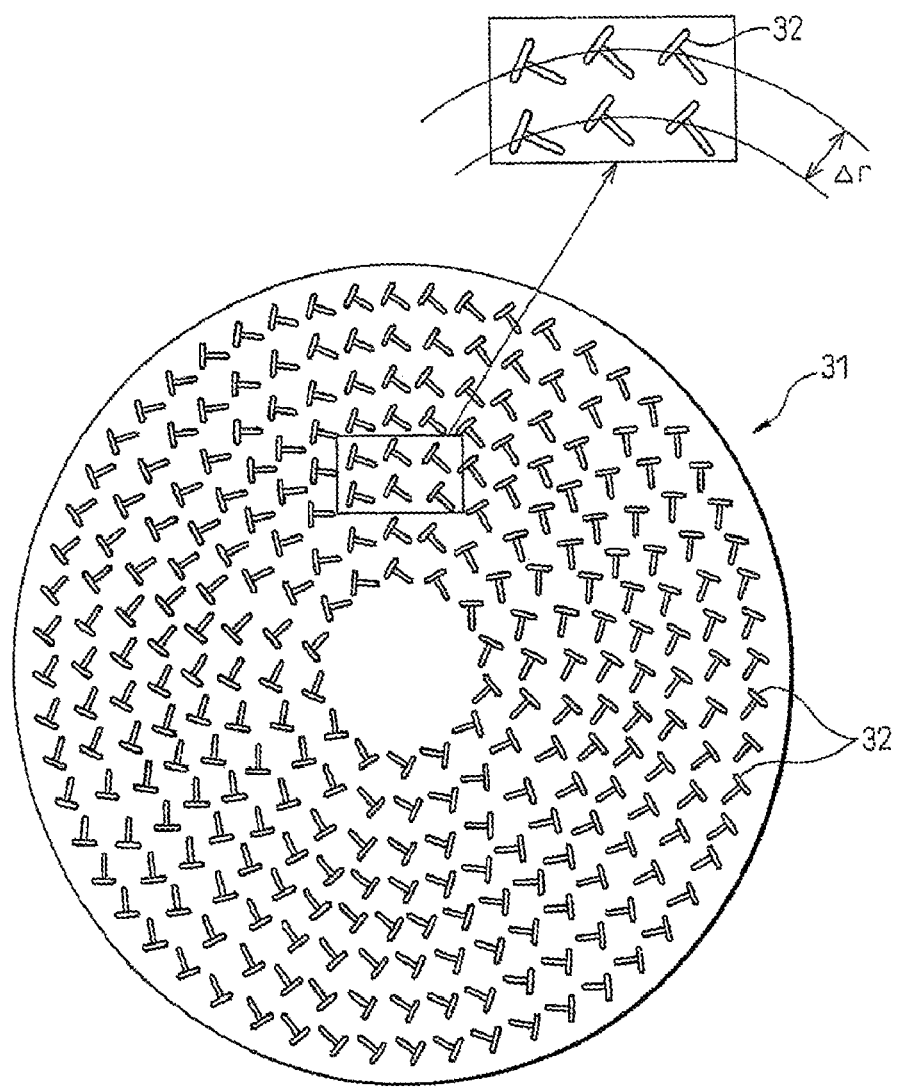
FIG. 3 illustrates a structure of a plane antenna.

FIG. 2 is a cross-sectional view showing mimetically a schematic constitution of a plasma processing apparatus 100 applicable to both the plasma oxidation process and the plasma modifying process that is performed in substrate processing system 200. Also, FIG. 3 is a plan view illustrating a plane antenna of plasma processing apparatus 100 shown in FIG. 2.

Plasma processing apparatus 100 is configured with the Radial Line Slot Antenna (RLSA) microwave plasma processing apparatus that introduces a microwave into a process chamber through a plane antenna, in particular configured with RLSA having a plurality of slot-type holes, thereby capable of generating microwave excitation plasma with a high density and a low-electron temperature. Because it is possible to process with plasma having the density of $1 \times 10^{10}/cm^3$ to $5 \times 10^{12}/cm^3$ and the low electron temperature of 0.7 to 2 eV (especially less than 1.1 eV in the vicinity of wafer W), there is no plasma damage on wafer W. Therefore, plasma processing apparatus 100 is suitable to use for oxidizing silicon with plasma to form a silicon oxide film, e.g. $SiO_2$ film and for modifying the silicon oxide film without plasma damage in manufacturing a variety of semiconductor devices.

Plasma processing apparatus 100 includes, as main components, a chamber (process chamber; 1) configured to be airtight, a gas supply unit 10 for supplying gas into chamber 1, an exhaust device 24 for depressurizing and exhausting the inside of chamber 1, a microwave introduction unit 27 established on the top of chamber 1 for introducing microwave into chamber 1, and a control unit 50 for controlling the respective components like the above in plasma processing apparatus 100.

Chamber 1 is formed of an approximately cylindrical container which is grounded, and may be formed of a prism-shaped container. Chamber 1 has a bottom wall 1*a* and a side wall 1*b* made of a material such as aluminum.

A placing table 2 is established inside chamber 1 for holding a wafer W horizontally. Placing table 2 is made of a material with a high thermal conductivity e.g. ceramics, such as AlN or the like. Placing table 2 is held by a cylindrical supporting member 3 extending upward from the center of bottom of an exhaust chamber 11. Supporting member 3 is made of ceramics, such as AlN or the like.

Further, a cover ring 4 is installed in placing table 2 for covering the outer edge part of placing table 4 thereby guiding wafer W. Cover ring 4 is an annular member made of a material, such as quartz, AlN, Al2O3, SiN, or the like.

Further, a resistance heating type heater 5 is embedded in placing table 2 as a temperature control apparatus. Heater 5 is supplied with power from a heater power supply 5*a* to heat placing table 2, thereby uniformly heating wafer W which is a substrate to be processed.

Further, placing table 2 is provided with a thermocouple (TC, 6). By measuring the temperature with thermocouple 6, the heating temperature of wafer W controlled within a range of e.g., from room temperature to 900° C. And, hold pins (not shown) are installed in placing table 2 for holding and elevating wafer W. Each of the hold pins in wafer W is established to be capable of protruding and retreating from the surface of placing table 2.

A cylindrical liner 7 made of quartz is provided on the inner circumference of chamber 1. And, a baffle plate 8 made of quartz with few impurities and having a number of exhaust holes 8*a* is provided in an annular shape on the outer circumference side of chamber 1 for exhausting uniformly the inside chamber 1. Baffle plate 8 is held by a plurality of supporting rods 9.

Bottom wall 1*a* of chamber 1 has a circular opening 10 formed at the approximately center part. Bottom wall 1*a* is provided with exhaust chamber 11 communicating with opening 10 and protruding downward. Exhaust chamber 11 is connected to an exhaust pipe 12 and connected to an exhaust device 24 such as vacuum pump through exhaust pipe 12.

A lid body 13 of which the center is opened annularly is provided on the top of chamber 1 for opening and closing chamber 1. The inner circumference of lid body 13 protrudes toward inside (space in chamber) to form an annular supporting part 13*a*. A gas introduction portion 15 having an annular shape is provided on side wall 1*b* of chamber 1. Gas introduction portion 15 is connected to a gas supply unit 18 for supplying oxygen-containing gas or gas for plasma excitation. Gas introduction portion 15 may be installed with a nozzle or shower structure. Further, a transfer gate 16 is provided on side wall 1*b* of the chamber for carrying in and out wafer W between plasma processing apparatus 100 and an adjacent transfer chamber (see FIG. 1), and a gate valve G1 is installed for opening and closing transfer gate 16.

Gas supply unit 18 includes, for example, an inert gas source 19*a*, an oxygen-containing gas source 19*b* and a hydrogen gas source 19*c*. Gas supply unit 18 may have other than the above gas sources (not shown), such as a purge gas source used to change an atmosphere in chamber 1, a gas source for cleaning used to clean the inside of chamber 1 or the like.

As for inert gas, for example, $N_2$ gas, noble gas or the like can be used. As for the noble gas, for example, Ar gas, Kr gas, Xe gas, He gas or the like can be used. It is preferable to use Ar gas, among them, in that it generates plasma stably and is economically feasible. Moreover, as for oxygen-containing gas, for example, oxygen gas ($O^2$), water vapor ($H_2O$), nitrogen monoxide (NO) or the like can be used.

Inert gas, oxygen-containing gas and hydrogen gas reach gas introduction portion 15 from inert gas source 19*a*, oxygen-containing gas source 19*b* and hydrogen gas source of gas supply unit 18 through gas lines 20, and then are introduced from gas introduction portion 15 into chamber 1. Respective gas lines 20 connected to respective gas sources are provided with a mass-flow control unit 21 and open/close valves 22 placed on the back and forth thereof. By the constitution of gas supply unit 18, it is possible to convert the supplied gas, control a flow rate thereof, and so on.

Exhaust device 24 comprises a vacuum pump, such as a high-speed vacuum pump e.g., a turbo molecular pump and others. As described above, the vacuum pump is connected to exhaust chamber 11 of chamber 1 through exhaust pipe 12. The gas inside chamber 1 flows uniformly in space 11*a* of exhaust chamber 11 and, as exhaust device 24 operates, the gas is exhausted from space 11*a* through exhaust pipe 12 outward. Accordingly, it is possible to depressurize the inside of chamber 1 to a predetermined vacuum-level (for example, 0.1333 Pa) at a high speed.

Next, the constitution of microwave introduction unit 27 will be explained. Microwave introduction unit 27 is provided on lid body 13 and includes, as main components, a transmitting plate 28, a plane antenna 31, a wave-retardation member 33, a cover member 34, a waveguide 37, a matching circuit 38 and a microwave generator 39.

Transmitting plate 28 is provided on support part 13*a* projecting toward the inner circumference of lid body 13. Transmitting plate 28 is made of a dielectric material such as quartz or ceramics e.g., $Al_2O_3$, MN or the like. A space between transmitting plate 28 and lid body 13 is sealed to be airtight through a sealing member 29. Therefore, the inside of chamber 1 is maintained airtight along with lid body 13.

Plane antenna 31, formed of a circular plate, is disposed above transmitting plate 28 to face placing table 2. The shape of plane antenna 31 is not limited to the circular plate and may be a rectangular plate. Plane antenna 31 is fixed to the top end of lid body 13 and grounded.

Plane antenna 31 is made of, for example, a copper plate, an aluminum plate, a nickel plate or an alloy plate of these metals with the surface thereof plated with gold or silver. Plane antenna 31 has a number of slot-type microwave radiation holes 32 for radiating microwave. Microwave radiation holes 32 are formed through plane antenna 31 in a predetermined pattern.

Each of microwave radiation holes 32, for example, as shown in FIG. 2, is formed with an elongated rectangular type (slot-type). And, microwave radiation holes 32 are typically arranged such that adjacent microwave radiation holes 32 form a T-shape. Microwave radiation holes 32 which are combined and arrayed to be a predetermined shape (e.g., a T-shape) as described above, also, are arrayed in an overall concentric circle.

The length and array intervals of microwave radiation holes 32 are determined in accordance with the wavelength ($\lambda$g) of microwave. For example, microwave radiation holes 32 are arrayed at intervals of $\lambda$g/4, $\lambda$g/2, or $\lambda$g. In FIG. 3, the intervals between adjacent microwave radiation holes 32 formed in a concentric circle are expressed with $\Delta$r. Microwave radiation holes 32 may have other shapes than the above, such as a circular shape, an arc shape, or the like. The array pattern of microwave radiation holes 32 is not limited to a specific one and may be, for example, a spiral shape or a radial shape besides the concentric shape.

Wave-retardation member 33 having a dielectric constant larger than that of vacuum is provided on the top surface of plane antenna 31. Wave-retardation member 33 has a function to adjust and shorten the wavelength of microwave because the wavelength of microwave becomes longer in a vacuum condition and is configured to effectively introduce the microwave into the chamber 1 from microwave radiation holes 32. As for a material of wave-retardation member 33, for example, quartz, PTFE (PolyTetraFluoroEthylene) resin, polyimide resin, or the like are available.

Though plane antenna 31 may be set in contact with or separated from transmitting plate 28 and, wave-retardation member 33 may be set in contact with or separated from plane antenna 31, it is preferable to set them in contact with for effectively introducing the microwave into chamber 1.

Cover member 34 is installed at the top of chamber 1 so as to cover plane antenna 31 and wave-retardation member 33, and cover member 34 and plane antenna 31 constitutes a flat waveguide. Cover member 34 is made of a metal material, such as aluminum or stainless steel. The top of lid body 13 and cover member 34 are sealed through a shield member 35. And cover member 34 is provided with cooling water passages 34a formed therein. By having the cooling water to flow and pass through the cooling water passages, it become possible to cool cover member 34, wave-retardation member 33, plane antenna 31, and transmitting plate 28. Also, cover member 34 is grounded.

Cover member 34 has an opening 36 formed at the center of the ceiling (ceiling part) connected to the waveguide 37. Waveguide pipe 37 is connected to microwave generator 39 for generating microwave at the other end through matching circuit 38.

Waveguide 37 includes a coaxial waveguide 37a which has a circular cross section and extends upward from opening 36 of cover member 34 and a rectangular waveguide 37b which is connected to the upper end of coaxial waveguide 37a through a mode converter 40 and extends in a horizontal direction. Mode converter 40 has a function of converting the microwave propagated in a TE mode into a TEM mode trough rectangular waveguide 37b.

Coaxial waveguide 37a includes an inner conductor 41 extending at the center. Inner conductor 41 is connected and fixed to the center of plane antenna 31 at the lower end. By this constitution, the microwave is propagated to inner conductor 41 of coaxial waveguide 37a and is propagated efficiently and uniformly in a radial shape into cover member 34 and a flat waveguide formed as plane antenna 31. The microwave with the reflected wave thereof suppressed in the flat waveguide is introduced from slots into the chamber.

According to the constitution of above microwave introduction unit 27, the microwave generated in microwave generator 39 is propagated to plane antenna 31 through waveguide 38 and introduced into chamber 1 through transmitting plate 28. The microwave has preferably a frequency of, e.g., 2.45 GHz, and moreover may have a frequency of 8.35 GHz, 1.98 GHz, or the like.

Figure 4:
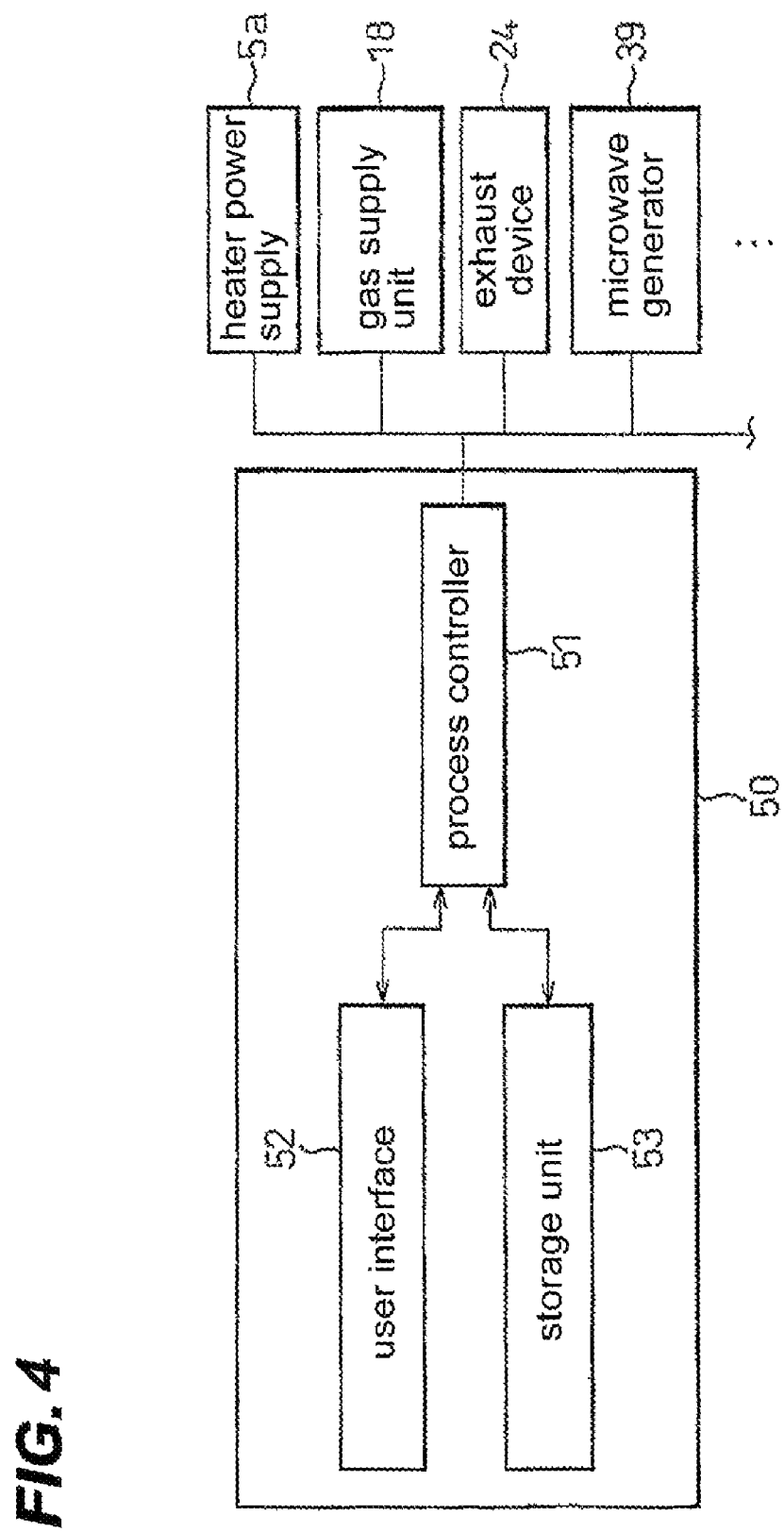
FIG. 4 is a diagram illustrating a configuration of a control unit.

Each of the respective components of plasma processing apparatus 100 is configured to be connected to and controlled by control unit 50. Control unit 50 has a computer and includes, for example, a process controller 51 comprising a CPU, a user interface 52 connected to process controller 51, and a storage unit 53 as shown in FIG. 4. Process controller 51 is a control means for integrating and controlling the respective components [e.g., heater power supply 5a, gas supply unit 18, exhaust device 24, microwave generator 39, and so forth] related to the processing condition, such as temperature, pressure, gas flow rate, or output of microwave, in plasma processing apparatus 100.

User interface 52 includes a key board used for a process manager to input commands for managing plasma processing apparatus 100, a display for visualizing and displaying an operation situation of plasma processing apparatus 100 and so forth. Also, storage unit 53 stores recipes containing a control program (software) for realizing various processes executed in plasma processing apparatus 100 by control of process controller 51, processing conditions data, or the like.

Further, as necessary, an arbitrary recipe may be retrieved from storage unit 53 and executed by process controller 51 in accordance with, for example, an instruction from user interface 52, and a desired process is carried out in chamber 1 of plasma processing apparatus 100 under the control of process controller 51. The recipes containing the control program and the process condition data may be stored in a computer readable storage medium, such as CD-ROM, hard disk, flexible disk, flash memory, DVD, BluRay disk, or the like to be used. Alternatively, the recipes may be used through online by transmitting from other apparatus in real time, e.g., through a dedicated line.

Plasma processing apparatus 100 constituted as described above can perform a plasma process which has no damage on the underlying film and less thermal budget at a low temperature below 600° C., and preferably below 500° C. Further, plasma processing apparatus 100 is able to realize a uniformity of process in a surface of wafer W even with a large diameter since the uniformity of plasma is excellent.

Figure 5:
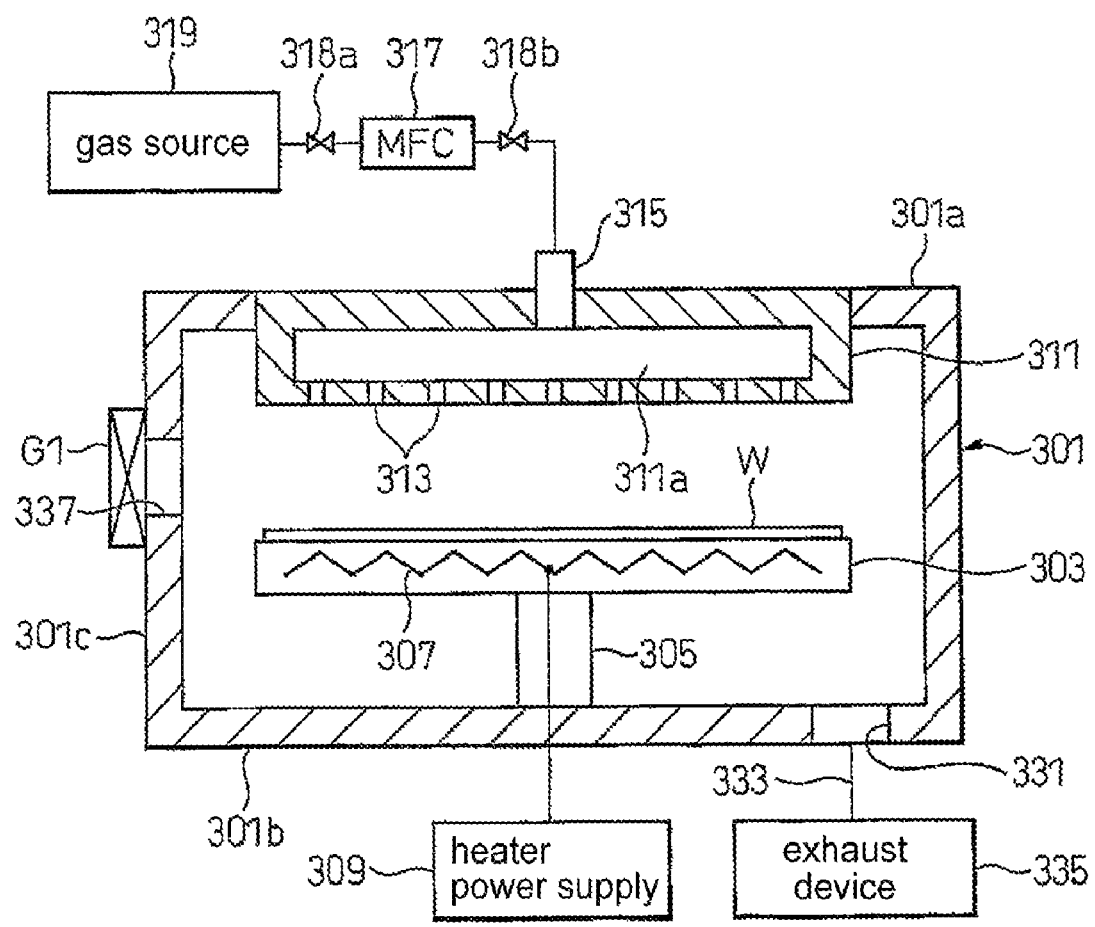
FIG. 5 is a schematic cross-sectional view illustrating one exemplary embodiment of a single wafer CVD film-forming processing apparatus suitable to perform a method for forming an insulating film according to the present invention.

An exemplary schematic constitution of a single wafer CVD film forming apparatus 300 applicable to process modules 101a, 101c is illustrated in FIG. 5. Single wafer CVD film forming apparatus 300 includes an approximately cylindrical processing container 301 configured to be airtight. An placing table 303 for holding the wafer as a substrate in a horizontal state is arranged inside process chamber 301. Placing table 303 is supported by a cylindrical supporting member 305. Further, a heater 307 is embedded in placing table 303.

Heater 307 is supplied with power from a heater power supply 309 to heat wafer W at a predetermined temperature.

An opening and closing ceiling wall 301a of processing container 301 is equipped with a shower head 311. Shower head 311 has a gas diffusion space 311a inside thereof. And, a number of gas discharge holes communicating with gas diffusion space 311a are formed on the under surface of shower head 311. And, a gas supply pipe 315 communicating with gas diffusion space 311a is connected to the center portion of shower head 311. Gas supply pipe 315 is connected, through a mass-flow controller (MFC; 317) and valves 318a, 318b placed on back and forth thereof, to a gas source 319 for supplying a raw gas for film forming such as, for example, dichloro-silane, N2O, and so forth, or a purge gas for substituting the atmosphere in processing container 301. And, the above raw gas for film forming is supplied to shower head 311 through gas supply pipe 315 and mass-flow controller 317.

An exhaust hole 331 is formed on bottom wall 301b of processing container 301 and an exhaust device 335 is connected to exhaust hole 331. Further, once operated, exhaust device 335 is configured to depressurize the inside of processing container 301 to a predetermined vacuum level. A raw gas supplied into processing container 301 through shower head 311 may turn to be plasma for forming a film by supplying a high frequency electric power to shower head 311 from a high frequency power supply (not shown).

Additionally, a carrying in-and-out opening 337 for carrying in and carrying out wafer W is formed on side wall 301c of processing container 301 and wafer W is carried in and out through carrying in-and-out opening 337. A gate valve G1 opens and closes carrying in-and-out opening 337.

In single wafer CVD film forming apparatus 300 with the constitution as described above, when wafer W is arranged on placing table 303, a thin film of, e.g., $SiO_2$ film can be formed on the surface of wafer W with the CVD method by supplying the raw gas from shower head 311 toward wafer W while heating wafer W by heater 307.

Single wafer CVD film forming apparatus 300 with the constitution as described above is also controlled by control unit 50 (see FIG. 4). It is possible to use LP (Low Pressure) film forming apparatus of a batch type as a CVD film forming apparatus without being limited to a single wafer type.

Figure 6:
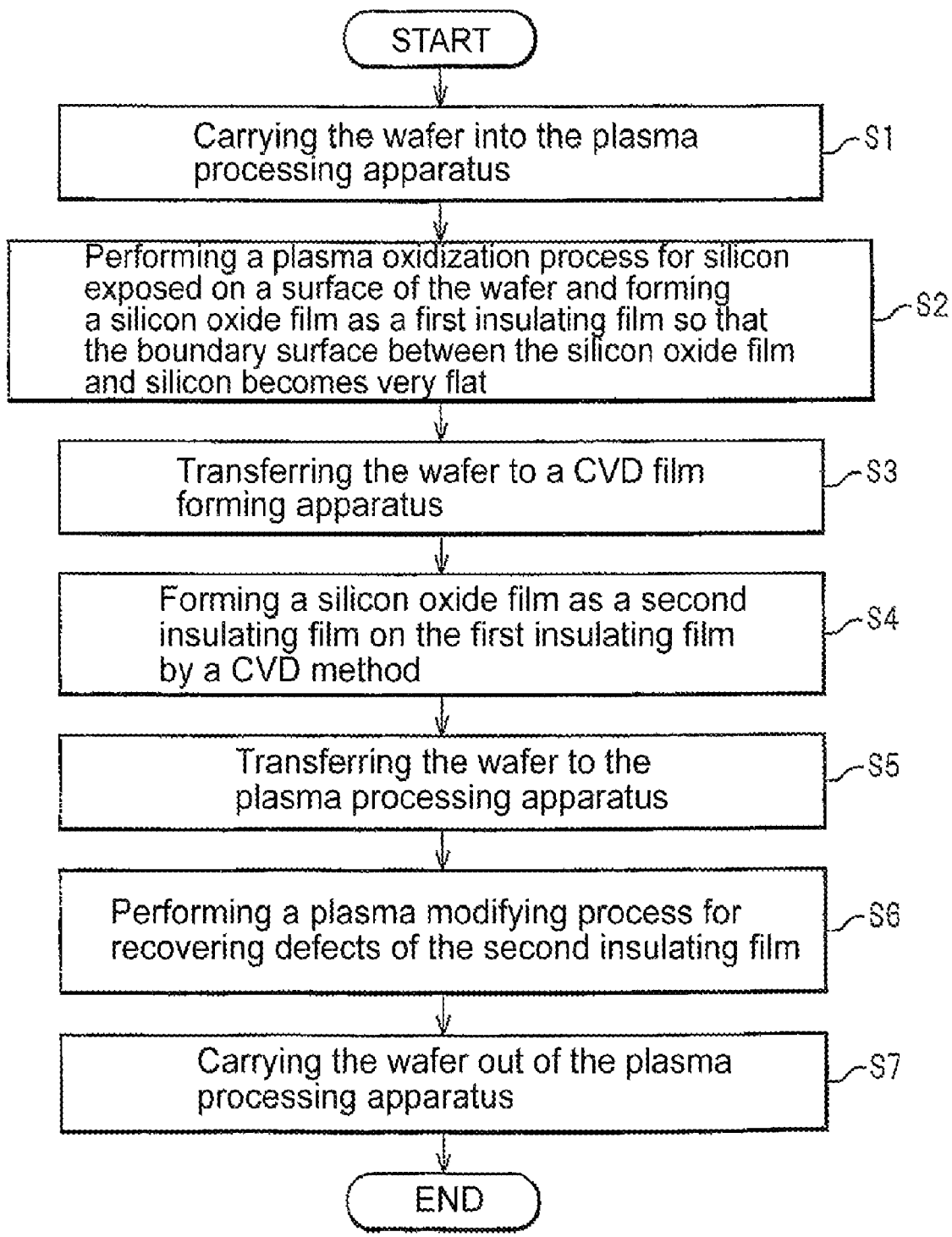
FIG. 6 is a flowchart illustrating steps of a method for forming an insulating film according to a first exemplary embodiment of the present invention.

Next, referring to FIGS. 6 and 7, descriptions will be made about a method for forming an insulating film including a plasma oxidization process and a plasma modifying process performed in substrate processing system 200. FIG. 6 is a flowchart illustrating steps of a method for forming an insulating film that includes oxidizing silicon with plasma to form a first insulating film, forming a second insulating film on the first insulating film, and modifying the second insulating film, and FIG. 7 are diagrams illustrating primary steps thereof.

Figure 7A:
FIG. 7A through 7E are schematic diagrams illustrating primary steps of the forming method of an insulating film according to the first exemplary embodiment of the present invention.
Figure 7A:
Figure 7B:
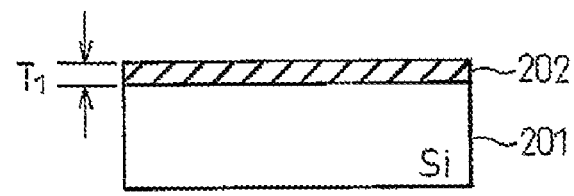

The method for forming an insulating film according to the present embodiment is performed by the steps from S1 to S7 as shown in FIG. 6. First, at step S1, wafer W that is an object to be processed is carried into plasma processing apparatus 100 (process module 101a) by transfer apparatus 109 in vacuum-side transfer chamber 103 according to the steps as described above. Next, at step S2, the plasma oxidization process is performed for a silicon layer 201 exposed on the surface of wafer W as shown in FIG. 7A. The surface of silicon layer 201 is oxidized to form a silicon oxide film 202 with a predetermined film thickness as a first insulating film by the plasma oxidization process. The plasma oxidization process is performed according to following procedures and conditions.

[Procedures of Plasma Oxidization Process]

First of all, noble gas and oxygen-containing gas are respectively introduced into chamber 1 at predetermined flow rates from inert gas source 19a and oxygen-containing gas source 19b through gas introduction portion 15 while depressurizing and exhausting the inside of chamber 1 of plasma processing apparatus 100. By doing this, the inside of chamber 1 is adjusted to a predetermined pressure.

Next, a microwave having a predetermined frequency, e.g., 2.45 GHz and generated in microwave generator 39 is induced into waveguide 37 through matching circuit 38. The microwave induced into waveguide 37 is sequentially passed through the rectangular waveguide 37b and coaxial waveguide 37a and then supplied to plane antenna 31 through inner conductor 41. That is, the microwave is propagated in the TE mode inside rectangular waveguide 37b, converted from the TE mode into the TEM mode in mode converter 40, and propagated in the TEM mode through coaxial waveguide 37a toward plane antenna 31. Then, the microwave is radiated from slot-type microwave radiation holes 32 formed to penetrate plane antenna 31 through transmitting plate 28 to the space above wafer W in chamber 1. Here, the microwave power can be selected from the range of 1000 W and 5000 W according to the purposes, when processing wafer W having a diameter larger than 200 mm, for example.

An electromagnetic field is formed inside chamber 1 by the microwave passed through transmitting plate 28 from plane antenna 31 and then radiated into chamber 1, and thereby the inert gas and the oxygen-containing gas are respectively turned into plasma. This microwave excitation plasma is turned into plasma with a high density of about $1 \times 10^{10}/cm^3$ to $5 \times 10^{12}/cm^3$ and a low electron temperature of below about 1.1 eV around wafer W. The microwave excitation high density plasma formed like this is plasma, for example, in which $O(^1D_2)$ radicals and $O_2^+$ ions are predominant as the active species, and silicon layer 201 on the surface of wafer W is oxidized by the action of the plasma so that the silicon oxide film 202 with less plasma damage is formed.

[Conditions of the Plasma Oxidation Process]

It is preferable to use noble gas and oxygen-containing gas as for a processing gas of the plasma oxidation process. It is preferable to use Ar gas as for noble gas and $O_2$ gas as for oxygen-containing gas respectively. In this case, a volume flow rate ratio of the $O_2$ gas over an entire processing gas (a percentage of the flow rate of the $O_2$ gas over a entire processing gas) is preferably set to be within a range of 0.1 and 30%, and more preferably to be within a range of 0.5 and 3%, from the viewpoint of increasing the density of $O_2^+$ ions and $O(^1D_2)$ radicals in the plasma as active species. For example, when processing a wafer W with a diameter above 200 mm, a flow rate of Ar gas may be set to be within a range of 50 and 5000 mL/min (sccm) and a flow rate of $O_2$ gas may be set to be within a range of 0.05 and 1000 mL/min (sccm) such that the above-described gas flow rate ratio is met.

Further, from the viewpoint of increasing the density of $O_2^+$ ions and $O(^1D_2)$ radicals in the plasma as active species, a processing pressure may preferably be within a range of 6.7 and 267 Pa, and more preferably be within a range of 6.7 and 67 Pa.

Further, from the viewpoint of effectively generating $O_2^+$ ions and $O(^1D_2)$ radicals as active species in the plasma, a power density of the microwave may be within a range of 0.5 and 3 $W/cm^2$, and preferably be within a range of 0.51 and 2.56 $W/cm^2$. The power density of microwave indicates a power of microwave supplied per unit area of 1 $cm^2$ (hereinafter, the same). For example, when processing wafer W with a diameter above 200 mm, the microwave power may preferably set to be within a range of 1000 and 5000 W.

And, a heating temperature of wafer W, as a temperature of placing table 2, is preferably within a range of 200 and 400° C. and more preferably to be set within a range of 400 and 600° C.

The film thickness $T_1$ of the silicon oxide film 202 formed on silicon layer 201 of wafer W by the oxidation process may preferable be within a range of 3 and 10 nm, and more preferably be within a range of 4 and 8 nm from the viewpoint of increasing the flatness of the interface between silicon layer 201 and silicon oxide film 202.

The above described conditions are stored as recipes in storage unit 53 of control unit 50. And, process controller 51 reads out the recipes and transmits control signals to the respective components of plasma processing apparatus 100, such as gas supply unit 18, exhaust device 24, microwave generator 39, heater power source 5a and so forth, thereby performing the plasma oxidation process under a desired condition.

Next, at step S3, transfer apparatus 109 in vacuum-side transfer chamber 103 transfers wafer W formed with the silicon oxide film thereon to single wafer CVD film forming apparatuses 300 (process module 101b or 101c). Here, transfer apparatus 109 in vacuum-side transfer chamber 103 transfers wafer W in the vacuum state.

Figure 7C:
Figure 7C:
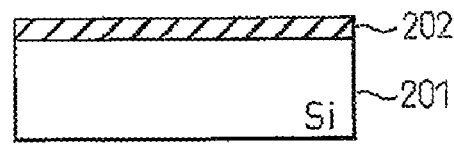
Figure 7D:
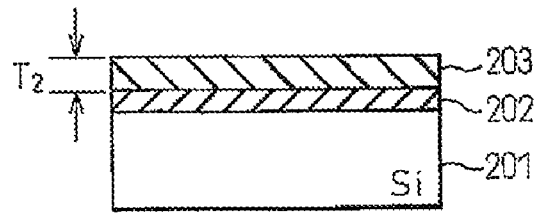
Figure 7E:
Figure 7E:
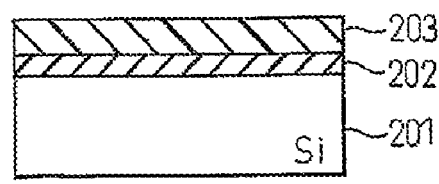

Next, at step S4, a film forming process is performed by a CVD method on silicon oxide layer 202 formed on the surface of wafer W as shown in FIG. 7C. Accordingly, silicon oxide film 203 as a second insulating film is formed on silicon oxide film 202, as shown in FIG. 7D. A thermal CVD method is used as the CVD method in the present embodiment utilizing substrate processing system 200. However, a plasma CVD method, a decompression CVD method or a normal pressure CVD method may also be used for forming a film. Also, a film forming method may be a single wafer type or a batch type.

The film thickness $T_2$ of silicon oxide film 203 formed on silicon oxide film 202 of wafer W by the CVD film forming process is preferably within a range of 3 and 10 nm, and more preferably within a range of 4 and 8 nm from the viewpoint of increasing the modifying effect in the direction of the film thickness.

Next, at step S5, wafer W formed with silicon oxide films 202 and 203 thereon is transferred to plasma processing apparatus 100 (process module 101d) as the plasma modifying processing apparatus. Here, transfer apparatus 109 in vacuum-side transfer chamber 103 transfers wafer W in the vacuum state. Next, at step S6, the plasma modifying process is performed for silicon oxide film 203. Procedures of the plasma oxidation process may be applied correspondingly to those of the plasma modifying process using plasma processing apparatus 100, and hence the description of procedures of the plasma modifying process will be omitted. Conditions of the plasma modifying process at step S6 are as follows.

[Conditions of the Plasma Modifying Process]

It is preferable to use noble gas and oxygen-containing gas as for a processing gas of the plasma modifying process. It is preferable to use Ar gas as for noble gas and $O_2$ gas as for oxygen-containing gas respectively. In this case, a volume flow rate ratio of the $O_2$ gas over the entire processing gas (a percentage of the flow rate of the $O_2$ gas over a entire processing gas) is preferably set to be within a range of 0.1 to 30%, and more preferably to be within a range of 0.1 to 5%, from the viewpoint of generating high density $O_2^+$ ions and $O(^1D_2)$ radicals as active species in the plasma. For example, when processing a wafer W with a diameter above 200 mm, a flow rate of the Ar gas may be set to be within a range of 500 to 5000 mL/min (sccm) and a flow rate of O2 gas may be set to be within a range of 0.5 to 1000 mL/min (sccm) such that the above-described gas flow rate is met.

Further, from the viewpoint of generating high density $O_2^+$ ions and $O(^1D_2)$ radicals as active species in plasma, a processing pressure may preferably set to be within a range of 6.7 to 267 Pa, and more preferably set to be within a range of 6.7 to 67 Pa. Further, from the viewpoint of increasing the plasma density and effectively generating $O_2^+$ ions and $O(^1D_2)$ radicals as active species in plasma to recover defects in silicon oxide film 203, a power density of microwave may preferably set to be within a range of 0.51 to 2.56 W/cm². The power density of microwave indicates power of microwave supplied per unit area of 1 cm² (hereinafter, the same). For example, when processing a wafer W having a diameter of larger than 200 mm, the microwave power may preferably be set to be within a range of 1000 to 5000 W. And, a heating temperature of wafer W, as a temperature of placing table 2, may preferably be set within a range of 200 to 400° C., and more preferably to be set within a range of 400 to 600° C.

The above described conditions are stored in storage unit 53 of control unit 50 as recipes. And, process controller 51 reads out the recipes and transports control signals to the respective components of plasma processing apparatus 100, such as gas supply unit 18, exhaust device 24, microwave generator 39, heater power source 5a and so forth, thereby performing the plasma modifying process under a desired condition.

After the plasma modifying process at step S6 is completed, the processed wafer W is carried out of plasma processing apparatuses 100 (process module 101d) by transfer apparatus 109 in vacuum-side transfer chamber 103, and stored in wafer cassette CR of load port LP in the above procedures.

As explained above, substrate processing system 200 can successively perform the oxidation process of the silicon substrate by the plasma oxidation process, film forming process of silicon oxide film 203 by the CVD method, and the modifying process of silicon oxide film 203 in a vacuum state. The film forming process of the silicon oxide film by the CVD method may preferably be performed in a separate system. Moreover, process modules 101a, 101d may preferably be configured to perform both the plasma oxidation process of step S2 and the plasma modifying process of step S6.

[Action]

Figure 8A:
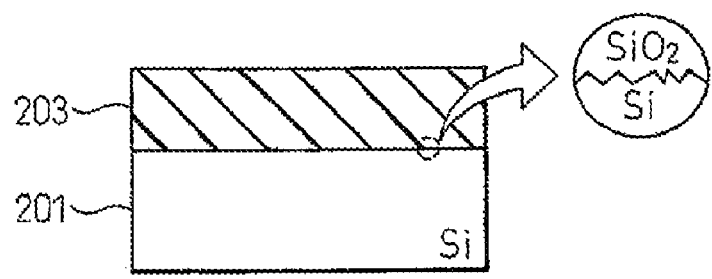
FIGS. 8A and 8B are schematic diagrams illustrating a flattening mechanism of the interface of $Si/SiO_2$ in a plasma oxidization processing.
Figure 8B:
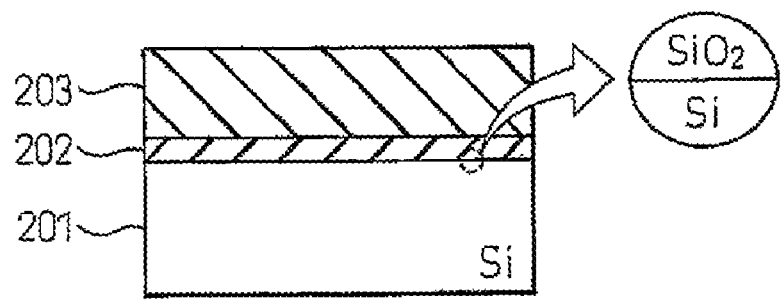

Next, an action mechanism of the method for forming the silicon oxide film performed by the substrate processing apparatus 200 will be explained with reference to FIGS. 8A and 8B. A silicon oxide film 203 formed on the surface of a silicon layer 201 by normal CVD method is a film deposited by heat. At the beginning of the film forming, the surface of silicon is thermally oxidized by the heat to form a silicon oxide film. However, because of the directionality of the crystal plane in silicon as shown in FIG. 8A, microscopic asperity portions are formed on the interface between silicon layer 201 and silicon oxide film 203, and the microscopical flatness of the interface with silicon layer 201 is poor. Also, many defects are formed in the vicinity of the interface between silicon layer 201 and silicon oxide film 203 ($SiO_2$/Si interface), and the interface-level density becomes higher. As a result, the mobility of carriers becomes lower so that working speed of the device, e.g. transistors becomes lower or a leak current increases, so that the electrical performance of the device is deteriorated.

The method for forming an insulating film according to the present embodiment oxidizes the surface of silicon layer 201 with plasma at a low pressure and a low oxygen partial pressure using plasma processing apparatus 100, prior to the CVD process. The interface between thus-formed silicon oxide film 202 and silicon layer 201 (SiO$_2$/Si interface) can be formed with improved flatness as shown in FIG. 8B. As a result, in the vicinity of the interface between thus-formed silicon oxide film 202 and silicon layer 201 (SiO$_2$/Si interface), less defects are generated and an increase of the interface-level density is suppressed. And, a silicon oxide film 203 with a predetermined film thickness is formed on silicon oxide film 202 by the CVD method. Also, the plasma modifying process is performed for silicon oxide film 203 using plasma processing apparatus 100. The present plasma processing apparatus is preferable for the plasma modifying process.

When generating plasma of a processing gas containing oxygen by using plasma processing apparatus 100, $O_2^+$ ions, $O(^1D_2)$ radicals and $O(^3P_j)$ radicals are predominantly generated as oxide active species. Also, while "j" in $O(^3P_j)$ radicals represents 0~2, $O(^3P_2)$ radicals are the most generated radicals among them. Among those oxide active species, $O_2^+$ ions have a large energy (12.1 eV) and act on the Si—Si bond or a bond between Si and impurity element, thereby acting to break the bond. $O(^1D_2)$ radicals (4.6 eV) play a principal role on Si reaction and enter easily to the Si—Si bond or the bond between Si and impurity element broken by $O_2^+$ ions, thereby forming a stable Si—O—Si bond. $O(^3P_j)$ radicals lack of energy (2.6 eV) and thus hardly contribute to oxidation of Si. Therefore, in order to modify a silicon oxide film, plasma including a lot of $O_2^+$ ions and $O(^1D_2)$ radicals need to be generated. $O_2^+$ ions and $O(^1D_2)$ radicals are generated far more under a low processing pressure condition (below 267 Pa, preferably 6.7 to 267 Pa, more preferably 6.7 to 67 Pa), and the amount of generation decreases along with the increase of the processing pressure. Meanwhile, the generation amount of $O(^3P_j)$ radicals do not change largely according to the pressing pressure. Consequently, by generating plasma at a low processing pressure, plasma including a lot of $O_2^+$ ions and $O(^1D_2)$ radicals is generated so that the modification on a silicon oxide film can be accomplished effectively.

Figure 9:
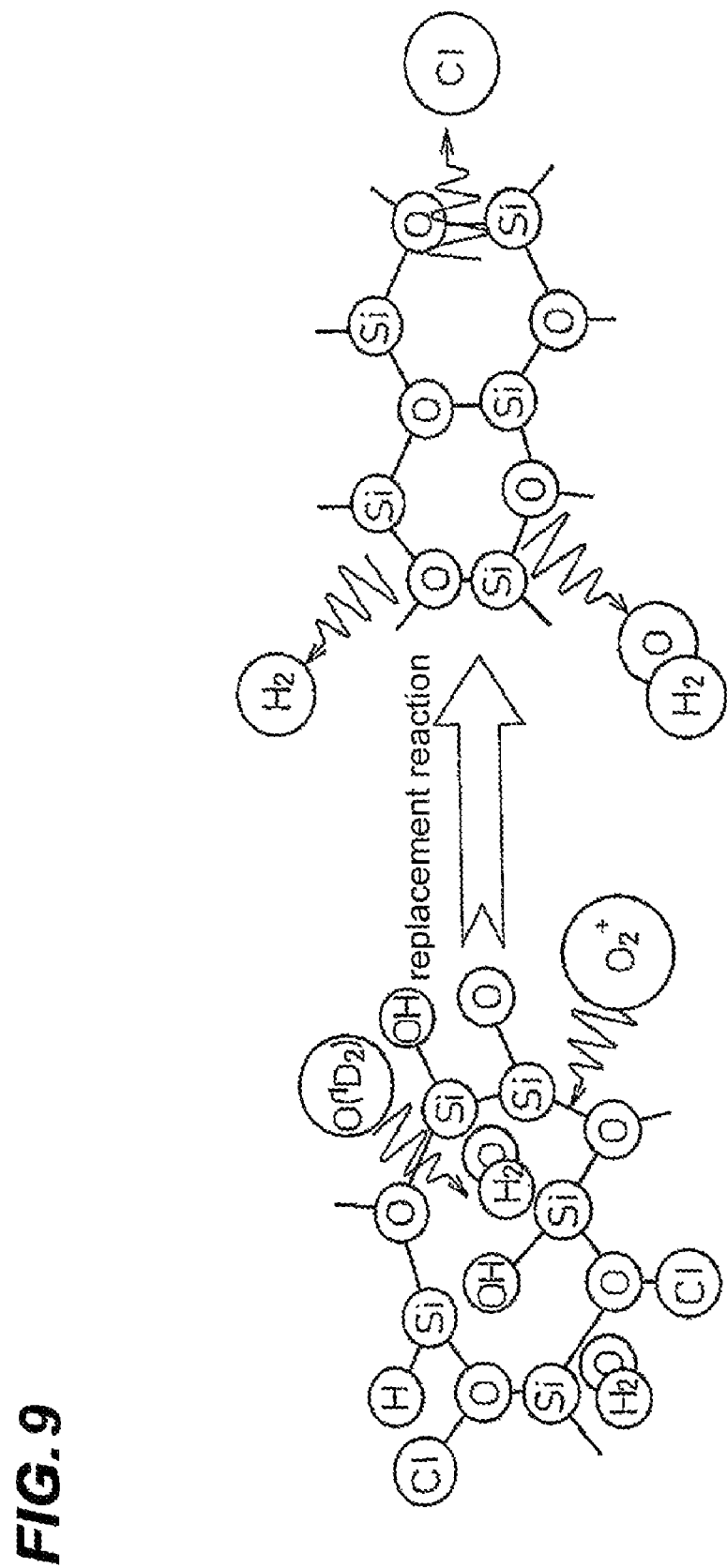
FIG. 9 is a diagram illustrating mimetically a modification mechanism in the plasma oxidization processing.

FIG. 9 shows mimetically the chemical changes occurred in the silicon oxide film by the plasma modifying process. As shown in FIG. 9, when plasma including abundant $O_2^+$ ions and $O(^1D_2)$ radicals is applied to the silicon oxide film, $O_2^+$ ions act on the dangling bonds of Si to activate the bond at first, and then $O(^1D_2)$ radicals make the reaction to progress easily, thereby forming a stable Si—O—Si bond. As a result, the dangling bonds included in a coarse silicon oxide film decrease, and unstable impurities such as Cl, H, OH and others included in silicon oxide film 203 and derived from the raw material for forming a film in the CVD method are further discharged out of the film by the replacement with radicals. According to the mechanism as described above, silicon oxide film 203 is modified to be a high quality film being dense and having fewer impurities or dangling bonds. Meanwhile, in a high pressure condition (for example, 333 Pa), $O_2^+$ ions or $O(^1D_2)$ radicals are decreased in plasma as active species, and $O(^3P_j)$ radicals become predominant instead. Because $O(^3P_j)$ radicals themselves are not active and have a property of penetrating into silicon oxide film (203), an excellent modification effect cannot be obtained under the plasma generating condition where $O(^3P_j)$ radicals become predominant, as compared to the plasma generating condition where $O_2^+$ ions or $O(^1D_2)$ radicals are abundant.

In the method for forming an insulating film according to the present embodiment, based on understanding that the active species in plasma such as $O_2^+$ ions and $O(^1D_2)$ radicals are changed depending on the processing pressure, an excellent modification effect has been achieved for the plasma modifying process of the coarse silicon oxide film 203 by selecting a low pressure condition (equal to or lower than 267 Pa) where $O_2^+$ ions and $O(^1D_2)$ radicals are abundant in plasma.

As explained above, the silicon oxide film is formed by oxidizing the silicon so that the flatness of the interface with the silicon is excellent, and an insulating film is formed on the silicon oxide film by the CVD method. Subsequently, the insulating film is modified by plasma containing oxygen thereby improving the quality of the film having a low interface-level density, dense, and having less impurities or dangling bonds at the SiO$_2$/Si interface. As a result, a high quality insulating film (silicon oxide films 202, 203) can be formed in which the decrease of the mobility of carriers that moves along the SiO$_2$/Si interface is suppressed and the electrical characteristics of the device are improved. The insulating film may be applicable to the gate insulating layer of Thin Film Transistor (TFT) devices, and in particular, may be advantageously utilized within a range of 5 nm and 1000 nm, more preferably within a range of 8 nm and 100 nm.

Figure 10:
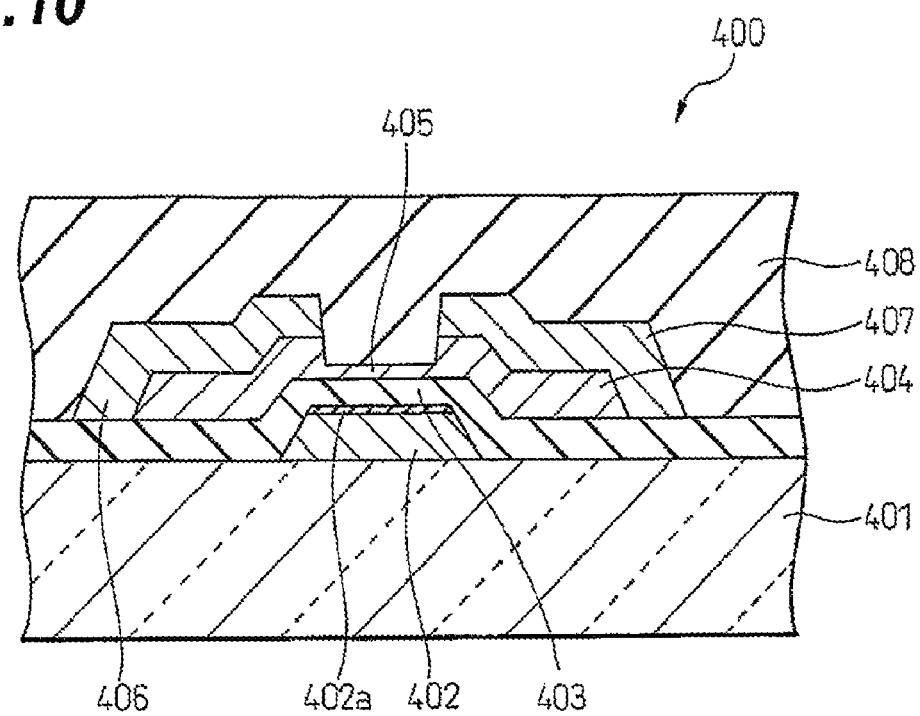
FIG. 10 is a schematic diagram illustrating a TFT device to which the method of forming an insulating film according to the first exemplary embodiment of the present invention can be applied.

FIG. 10 is a cross sectional view illustrating a schematic constitution of a TFT device 400 to which the method of forming an insulating film according to the present invention can be applied. A gate electrode 402, composed of, for example, polysilicon, is formed partially on a glass substrate 401. A thin film of a silicon oxide film 402*a* is formed on the surface of gate electrode 402. Then, a gate insulating film 403 composed of silicon dioxide(SiO$_2$) is formed so as to cover the surface of gate electrode 402 including silicon oxide film 402*a* and glass substrate 402. An a-Si(amorphous silicon) layer 404 is formed as a Si group film on gate insulating film 403 to form a transistor, and a channel portion 405 is formed over gate electrode 402. A source electrode 406 and a drain electrode 407 are formed on a-Si layer 404 including a high melting point metal material such as molybdenum, tungsten or the like. A passivation layer 408 composed of silicon nitride (Si$_3$N$_4$) is formed on source electrode 406 and drain electrode 407 to protect the surface of TFT device 400.

When the method for forming an insulating film according to the present embodiment is applied to TFT device 400 having constitutions as shown in FIG. 10, gate electrode 402 composed of polysilicon is patterned and formed on glass substrate 401, and thereafter, the surface thereof is oxidized with plasma using plasma processing apparatus 100. And then silicon oxide film 402*a* is formed on the surface of gate electrode 402. Next, gate insulating film 403 is formed using a CVD method so as to cover the surface of gate electrode 402 and glass substrate 401. Also, gate insulating film 403 is plasma modified to a silicon oxide film that is dense and has less impurities. The above process can be performed in the procedures of step Si or step S7 of FIG. 6. After that, TFT device 400 can be formed by repeating the film forming and etching processes, forming and patterning an a-Si film 404, forming and patterning source electrode 406 and drain electrode 407, and forming passivation film 408 and an ITO electrode (not shown) according to a normal method.

In TFT device 400 illustrated in FIG. 10, the interface between the insulating film (silicon oxide film 402*a* and gate insulating film 403) and gate electrode 402 composed of polysilicon after forming gate insulating film 403 using a CVD method, can be sufficiently flat by oxidizing the surface of gate electrode 402 with plasma using plasma processing apparatus 100 and forming silicon oxide film 402*a*. As a result, the defects are generated less and the increase of the interface-level density is suppressed in the vicinity of the interface between the insulating film (silicon oxide film 402a and gate insulating film 403) and gate electrode 402 (SiO$_2$/polysilicon interface). Accordingly, the decrease of mobility of carriers moving along the interface can be suppressed, thereby improving the electrical performance of TFT device 400.

Also, the quality of gate insulating film 403 can be modified and improved to be dense and have less impurities and dangling bonds, by performing the plasma modifying process at a low pressure condition using plasma processing apparatus 100. Also, it is preferable to form gate insulating film 403 using a plasma CVD method to form the film at a low temperature from the viewpoint of the thermal budget.

Next, a description will be made for experimental data on which the present invention is based. Using plasma modifying apparatus 100 shown in FIG. 2, a silicon oxide film formed with thermal CVD method is modified with plasma under conditions 1 through 4 (plasma modifying process). An increased amount of thickness, an increased amount of refractive index, and a wet etching rate by a 0.125% dilute hydrofluoric acid process (for 30 seconds) have been investigated regarding the silicon oxide film after the modification. Also, a MOS capacitor has been manufactured using the silicon oxide film as a gate insulator after the modification and then a leakage current density (Jg: −10 MV/cm), an insulation breakdown charge [Qbd: 63% (this indicates data that represent the number which is 63% of the total)], and the variation of an electron trapping (Δvge: 11 seconds) have been investigated as electric characteristics. For comparison, similar measurements have been made for the cases where a plasma modifying process has not been performed, modifying process has been performed only by annealing (thermal modifying process), and for the case of thermal oxide film (WVG method). The results are shown in Table 1.

[Plasma Modifying Process Condition 1]
Ar gas flow rate: 1000 mL/min (sccm)
O$_2$ gas flow rate: 300 mL/min (sccm)
Flow rate ratio (O$_2$/Ar+O$_2$):0.23
Processing pressure: 6.7 Pa
Temperature of placing table 2: 500° C.
Microwave power: 4000 W
Microwave power density: 2.05 W/cm$^2$ (per 1 cm$^2$ area of the transmitting plate)

[Plasma Modifying Process Condition 2]
Ar gas flow rate: 1980 mL/min (sccm)
O$_2$ gas flow rate: 20 mL/min (sccm)
Flow rate ratio (O$_2$/Ar+O$_2$):0.01
Processing pressure: 200 Pa
Temperature of placing table 2: 500° C.
Microwave power: 4000 W
Microwave power density: 2.05 W/cm$^2$ (per 1 cm$^2$ area of the transmitting plate)

[Plasma Modifying Process Condition 3]
Ar gas flow rate: 1200 mL/min (sccm)
O$_2$ gas flow rate: 400 mL/min (sccm)
Flow rate ratio (O$_2$/Ar+O$_2$):0.25
Processing pressure: 667 Pa
Temperature of placing table 2: 500° C.
Microwave power: 4000 W
Microwave power density: 2.05 W/cm$^2$ (per 1 cm$^2$ area of the transmitting plate)

[Plasma Modifying Process Condition 4]
Ar gas flow rate: 1200 mL/min (sccm)
O$_2$ gas flow rate: 370 mL/min (sccm)
H$_2$ gas flow rate: 30 mL/min (sccm)
Flow rate ratio (O$_2$/Ar+O$_2$+H$_2$):0.23
Flow rate ratio (H$_2$/Ar+O$_2$+H$_2$):0.019
Processing pressure: 667 Pa
Temperature of placing table 2: 500° C.
Microwave power: 4000 W
Microwave power density: 2.05 W/cm$^2$ (per 1 cm$^2$ area of the transmitting plate)

[Annealing Modifying Process Condition]
Atmosphere: N$_2$/O$_2$
Temperature: 900° C.
Pressure: 133 Pa

[Thermal Oxide Film Forming Conditions]
Atmosphere: H$_2$/O$_2$=450/900 mL/min (sccm)
Temperature: 950° C.
Pressure: 15000 Pa

[Thermal CVD Film Forming Conditions]
SiH$_2$Cl$_2$ gas flow rate: 75 mL/min (sccm)
N$_2$O gas flow rate: 150 mL/min (sccm)
Processing pressure: 48 Pa
Processing temperature: 780° C.

TABLE 1

| Classification | Variance of Thickness [nm] | Variance of Refractive index | Wet Etching rate [nm/min] |
|---|---|---|---|
| Plasma Modifying Process Condition 1 | −0.0356 | 0.018 | 1.4916 |
| Plasma Modifying Process Condition 2 | 0.0581 | 0.012 | 1.5068 |
| Plasma Modifying Process Condition 3 | 1.0749 | 0 | 2.5952 |
| Plasma Modifying Process Condition 4 | — | — | 3.0596 |
| Thermal Modifying Process by Annealing | — | — | 2.4904 |
| Thermal Oxide Film | — | — | 1.0504 |

From the physical analysis shown in Table 1, the refractive index is increased and the wet etching rate is decreased when the plasma modifying process has been performed under the condition 1 and the condition 2 where the pressure is below 200 Pa. Such data show that the quality of the silicon oxide film has been improved by the plasma modifying process so that the film density increased. And, comparing the conditions 1 and 2 of the plasma modifying process with the modifying process performed only by thermal annealing, it is represented that the modifying processes under the conditions 1 and 2 have a higher modification effect because the wet etching rate thereof is lower than the thermal modifying process. It is thought that impurities and dangling bonds in the film were reduced by plasma-generated O$_2^+$ and O($^1$D$_2$) radicals and the film became dense.

And, when the plasma modifying process has been performed under the condition 4, the variation of the refractive index has not be observed, and the wet etching rate has been almost the same as the thermal modifying process. That is, with regards to the improvement effect on the film quality, the results of the plasma modifying process under the condition 4 appears to be the same as the thermal modifying process. However, when the plasma modifying process has been performed under the condition 4, the generation of O$_2^+$ and O($^1$D$_2$) has appeared to be reduced due to the high processing pressure so that the modification effect is low and the increase in thickness of the silicon oxide film has been observed. It appears that the interface between the silicon oxide film formed with CVD method and the underlying silicon has been oxidized by O($^3$P$_j$) radicals thereby increasing the film thickness.

The above results indicates that, a low pressure condition such as, for example, 6.7 to 267 Pa is preferable from the viewpoint that it is easy to generate $O_2^+$ and $O(^1D_2)$ radicals. And, in the plasma modifying process under this condition, the film quality of the silicon oxide film formed with CVD method appears to have a high modification effect. Meanwhile, when the plasma modifying process has been performed under the high pressure condition where the processing pressure is above 267 Pa, it has been confirmed that the modification effect for the film quality of the silicon oxide film is low similar to the thermal modifying process and the thickness of the film has been increased.

From Table 2, it can be understood that, when the plasma modifying process is performed under the conditions 1 and 2, the v variation of the electron trapping ($\Delta$vge: 11 seconds) has been nearly reduced to half as compared to the thermal modifying process thereby being largely improved. When the plasma modifying process is performed under the condition 3, the variation of the electron trapping has been slightly improved as compared to the thermal modifying process. Therefore, it is confirmed that the characteristic of $\Delta$vge can be improved effectively by setting the $O_2/(Ar+O_2)$ ratio below 0.23.

TABLE 2

| Classification | Pressure [Pa] | $O_2/(Ar + O_2)$ ratio | Jg [A/cm$^2$] | Qbd [C/cm$^2$] | $\Delta$vge [11 sec] |
|---|---|---|---|---|---|
| Plasma modifying process condition 1 | 6.7 | 0.23 | $1.44 \times 10^{-4}$ | 33.1 | −0.13 |
| Plasma modifying process condition 2 | 200 | 0.01 | $1.74 \times 10^{-4}$ | 51.5 | −0.12 |
| Plasma modifying process condition 3 | 667 | 0.25 | $8.50 \times 10^{-4}$ | 10.2 | −.019 |
| Thermal modifying annealing | 133 | — | $7.57 \times 10^{-4}$ | 1.2 | −0.20 |
| Thermal oxide film | | | $3.00 \times 10^{-5}$ | 44.0 | 0.02 |

From the results of the evaluation of the electric characteristics shown in Table 2, the leakage current density (Jg) has been drastically reduced when the plasma modifying process has been performed under the conditions 1 and 2 at the low pressure below 200 Pa, as compared to the condition 3 at the high pressure of 667 Pa and the thermal modifying process.

Figure 11:
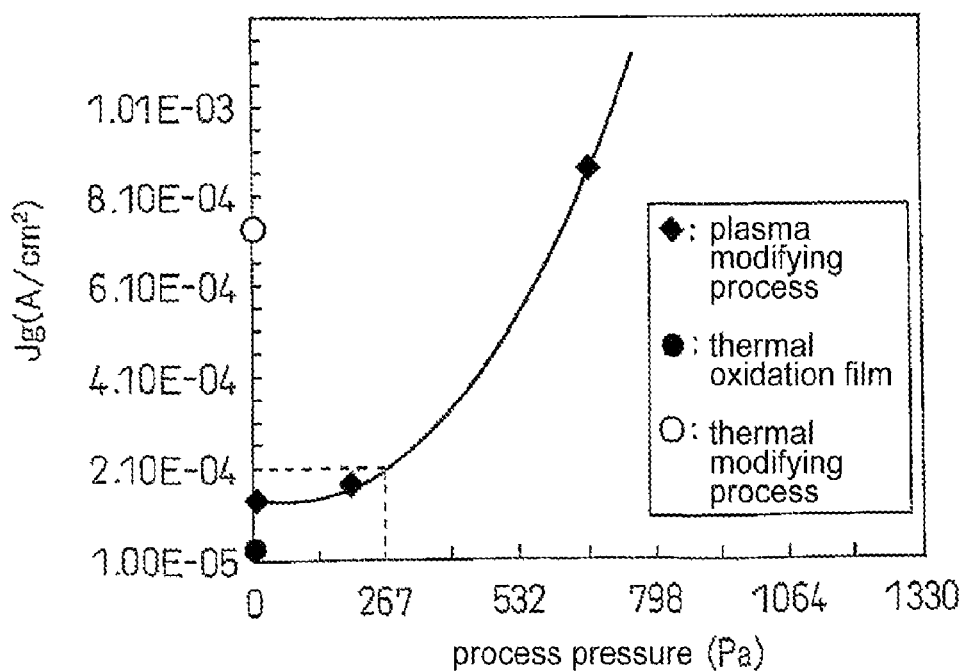
FIG. 11 is a graph showing a relationship between a processing pressure of plasma modifying process and a leakage current characteristic of a MOS capacitor

A relationship between the processing pressure of the plasma modifying process under the conditions 1 to 3 and the leakage current is shown in FIG. 11. And, FIG. 11 also shows the leakage current of the annealing modifying process and the thermal oxide film. It is understood that the leakage current can be suppressed to below $2.1 \times 10^{-4}$ [A/cm$^2$] if the processing pressure is below 267 Pa e.g., 6.7 to 267 Pa. Therefore, the processing pressure of the plasma modifying process may preferably be set to below 267 Pa for the purpose of improving the characteristic of the leakage current.

The insulation breakdown Qbd has been drastically improved by the plasma modifying process under the conditions 1 to 3 as compared to the thermal modifying process. In particular, when the plasma modifying process is performed under the condition 2, an excellent reliability has been shown which is superior to the thermal oxide film.

Figure 12:
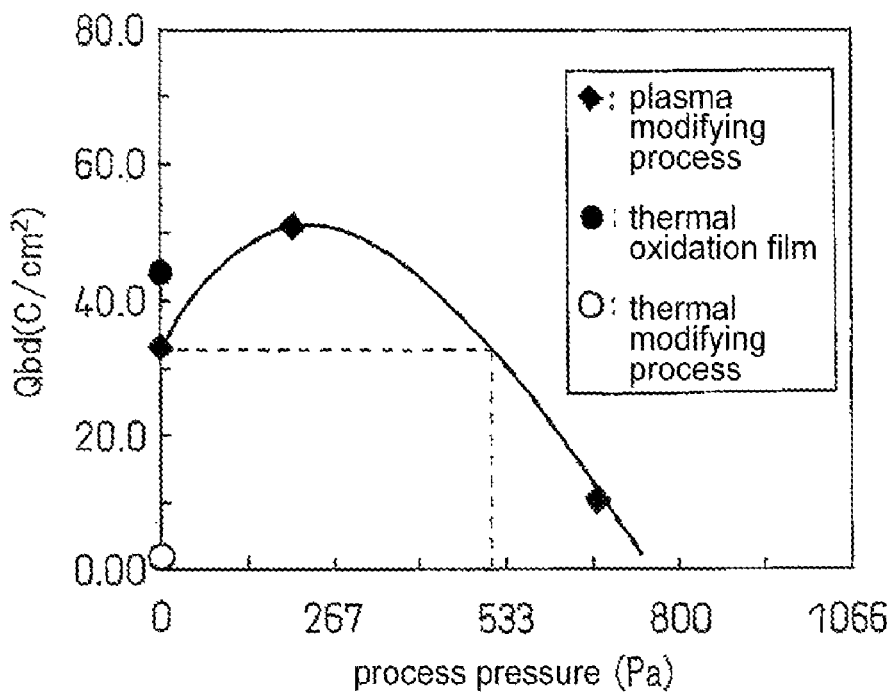
FIG. 12 is a graph showing a relationship between a processing pressure of plasma modifying process and a Qbd characteristic of a MOS capacitor.

A relationship between the processing pressure of the plasma modifying process under the conditions 1 to 3 and the Qbd is shown in FIG. 12. And, it also shows the thermal modifying annealing and the leakage current of the thermal oxide film. From FIG. 12, it is understood that the Qbd can be above 33 [C/cm$^2$] when the processing pressure is below 533 Pa. Therefore, the processing pressure of the plasma modifying process is preferably set to be below 533 Pa e.g., 6.7 to 533 Pa, more preferably 6.7 to 400 Pa, and desirably 6.7 to 267 Pa.

Figure 13:
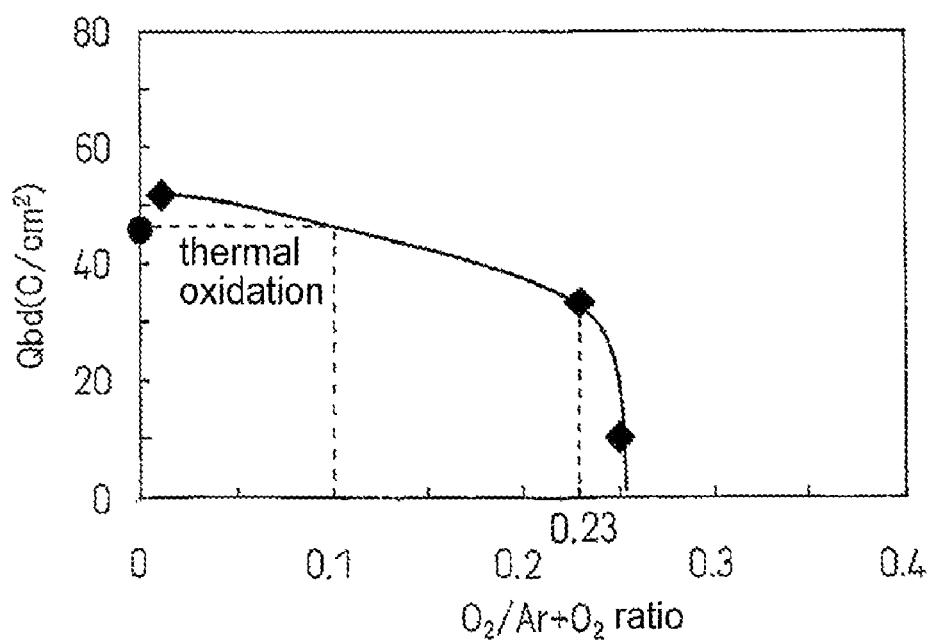
FIG. 13 is a graph showing a relationship between a $O_2/(Ar+O_2)$ ratio and a Qbd in the plasma modifying process.

Further, a relationship between the $(O_2/Ar+O_2)$ ratio of the plasma modifying process under the conditions 1 to 3 and the Qbd is shown in the FIG. 13. As shown in FIG. 13, it is confirmed that the Qbd characteristic may be effectively improved by setting the $(O_2/Ar+O_2)$ ratio below 0.23 thereby reducing the partial pressure of oxygen, and, in particular, a high Qbd characteristic may be achieved exceeding the thermal oxide film by setting the $(O_2/Ar+O_2)$ ratio below 0.1.

From the results as described above, it can be confirmed that by performing the plasma modifying process at the low process pressure below 267 Pa and the condition of the $O_2/(Ar+O_2)$ ratio below 0.23, the quality of the silicon oxide film, being dense and having less defects, can be improved to be the same level as or better than the thermal oxide film. Moreover, it can be further confirmed that the reliability of the electrical characteristics of the device can be improved by utilizing the modified silicon oxide film, Next, the variation of the residue amount of chlorine (originated from the raw material of $SiH_2Cl_2$) caused by the plasma modifying process, inside the silicon oxide film formed with the CVD method has been considered. The residue of the chlorine in the silicon oxide film has been measured by Total reflection X-ray Fluorescence (TXRF) analysis. Results are shown in Table 3.

TABLE 3

| Classification | Residue of chlorine [atoms/cm$^2$] |
|---|---|
| Plasma modifying process (modifying condition 2) | $1.0 \times 10^{13}$ |
| No modifying process | $5.60 \times 10^{13}$ |

Table 3 shows that, when the plasma modifying process is performed, the residue of chlorine has been reduced to one fifth as compared to the case when there was no modifying process indicating that the impurities in the silicon oxide film can be removed by the plasma modifying process. A thermal annealing may be performed after the plasma modifying process. Also, the residue of chlorine may be reduced to $9.60 \times 10^{11}$ [atoms/cm$^2$] by combining the plasma modifying process and the thermal annealing process.

Next, a silicon oxide film has been formed by oxidizing the silicon substrate with plasma using plasma processing apparatus 100 according to Conditions 5 through 7 as shown in Table 5. Then, the silicon oxide film has been peeled off to measure the state of the interface between the silicon oxide film and the silicon substrate ($SiO_2$/Si interface) with an Atomic Force Microscope (AFM), and calculate the flatness (RMS). The results are shown in Table 4 and FIG. 14. Also, for reference, the flatness (RMS) of the thermally oxidized silicon oxide film obtained by processing the silicon substrate with heat using a WVG (Water Vapor Generation) method, is shown in Table 4 and FIG. 14.

TABLE 4

|  | Condition 5 | Condition 6 | Condition 7 | WVG thermal Oxidation |
|---|---|---|---|---|
| Ar/O$_2$/H$_2$ flow rate [mL/min (sccm)] | 500/5/0 | 500/5/5 | 120/37/3 | 0/900/450 |
| O$_2$ partial pressure [Pa] | 1.33 | 1.31 | 154 |  |
| Process Pressure [Pa] | 133 | 133 | 667 | 15000 |
| Microwave Power [W] | 2750 | 2750 | 2750 |  |
| Microwave Power Density [W/cm$^2$] | 2.67 | 2.67 | 2.67 |  |
| Temperature [° C.] | 465 | 465 | 465 | 950 |
| Processing time [sec.] | 100 | 770 | 360 | 420 |
| Oxidation film thickness [nm] | 8 | 8 | 8 | 8 |
| Flatness(RMS) [nm] | 0.104 | 0.118 | 0.202 | 0.202 |

Figure 14:
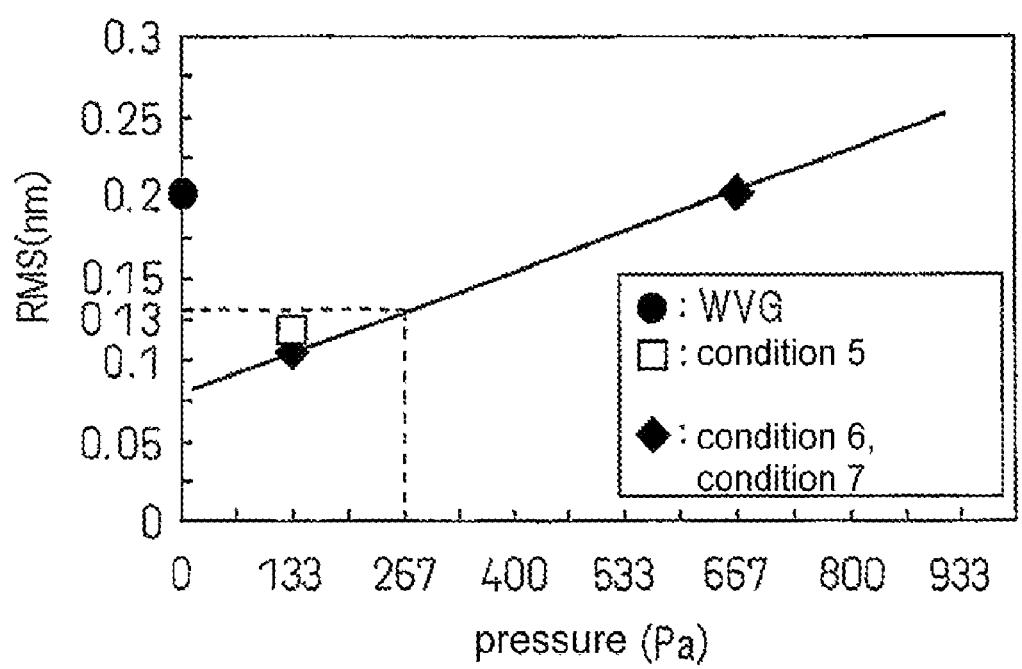
FIG. 14 is a graph illustrating measurement results of a flatness of $SiO_2/Si$ interface using an atomic force microscope.

From the results shown in Table 4 and FIG. 14, it is confirmed that the flatness (RMS) is below 0.13 nm and the state of the interface between the silicon oxide film and silicon (SiO$_2$/Si interface) can be formed sufficiently flat, in the conditions 5 and 6 that processed with plasma at the low processing pressure below 133 Pa using plasma processing apparatus 100. As compared with this, the flatness (RMS) is more than 0.2 nm, and the interface between the silicon oxide film and silicon (SiO$_2$/Si interface) cannot be formed sufficiently flat in the silicon oxide film formed by the thermal oxidation process or the plasma oxidation process with the high pressure condition of 667 Pa.

As the flatness (RMS) varies in the range of 0.1 nm and 0.2 nm, the flatness (RMS) affects the device performance greatly. The flatness (RMS) is preferably below 0.13 nm, e.g., in the range of 0.05 nm and 0.13 nm to maintain a good device performance. In the method for forming an insulating film according to the present embodiment, the flatness requirement can be satisfied by performing the plasma oxidation process using plasma processing apparatus 100.

From the above results, to maintain the flatness (RMS) of the interface between the silicon oxide film and silicon (SiO$_2$/Si interface) below 0.13 nm, the processing pressure of the plasma oxidation process is preferably set to be below 267 Pa (e.g., in the range of 6.7 Pa and 267 Pa), more preferably below 133 Pa (e.g., in the range of 6.7 Pa and 133 Pa), specially preferable below 67 Pa (e.g., in the range of 6.7 Pa and 67 Pa). Also, the oxygen partial pressure in the plasma oxidation process is preferably set to be below 5 Pa (e.g., in the range of 0.1 Pa and 5 Pa), more preferably below 2 Pa (e.g., in the range of 0.1 Pa and 2 Pa).

Also, from the comparison between condition 5 and condition 6, it is confirmed that it is preferable to add hydrogen to the process gas in the plasma oxidation process. In this case, the flow rate ratio of the hydrogen gas over the oxygen gas is preferably set to be above 25%, e.g., in the range of 25% and 75%, more preferably in the range of 50% and 75%.

As explained above, according to the method for forming an insulating film of the present embodiment, the silicon oxide film is formed in such a way that the interface between the silicon and the silicon oxide film functioning as the insulating film is sufficiently flat, as compared to the flatness of the silicon substrate used in device fabrication, and the insulating film is formed on the silicon oxide film by the CVD method. And the insulating film is modified using plasma to form the insulating film. As a result, for example, the method of the present embodiment may be advantageously applied to the application described above such as, for example, forming the gate insulating layer of a TFT device, where the necessity suppressing the interface-level density is high, and a dense and high quality insulating film is necessary.

Second Embodiment

Figure 15:
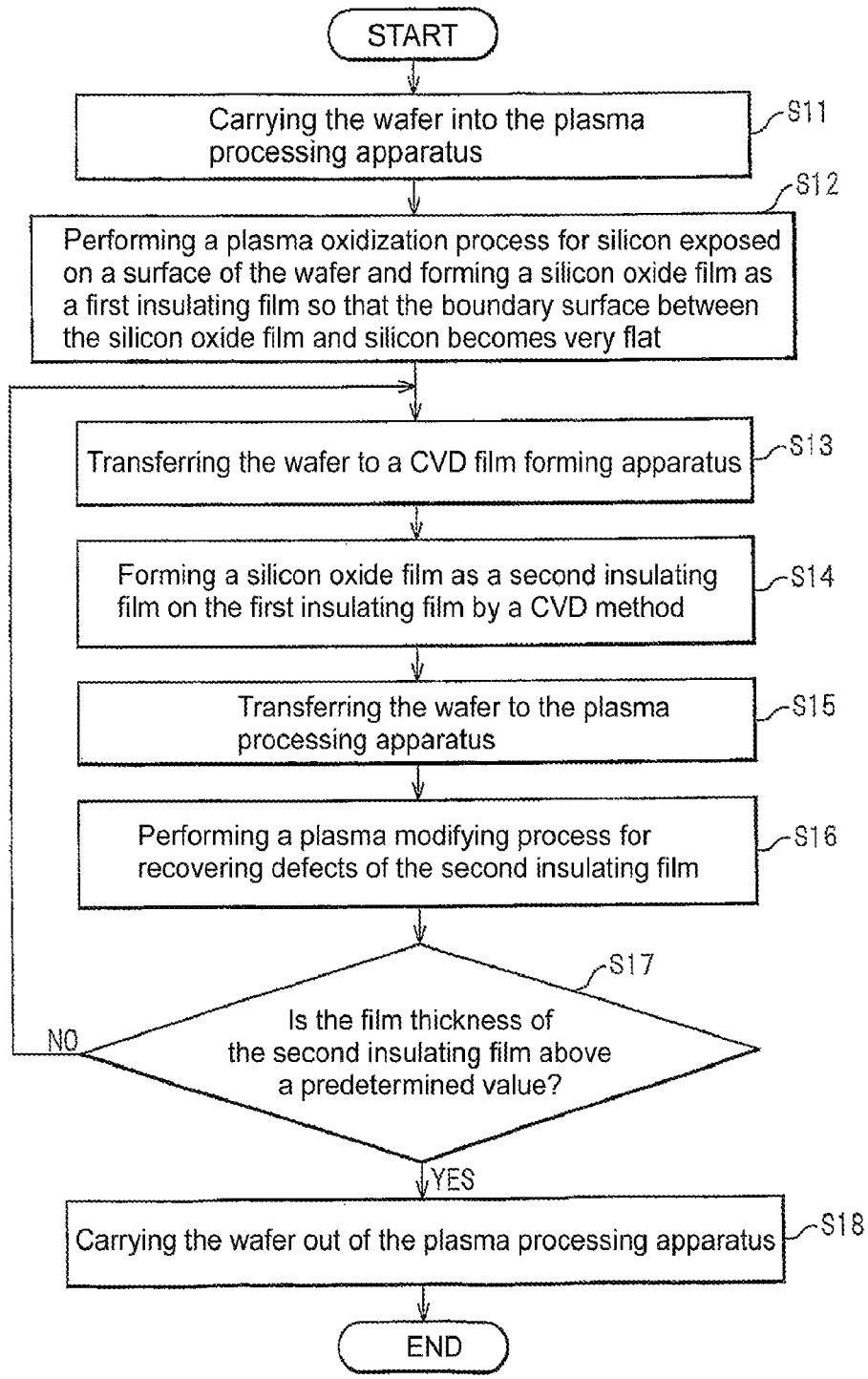
FIG. 15 is a flowchart illustrating steps of a method for forming an insulating film according to a second exemplary embodiment of the present invention.

Next, referring to FIGS. 15 and 16, a method for forming an insulating film according to the second exemplary embodiment of the present invention will be described. FIG. 15 is a flowchart illustrating steps of a method for forming an insulating film according to the second exemplary embodiment of the present invention, and FIGS. 16A-16H show primary steps thereof. In the present embodiment, a thick film with dense and good film quality can be formed by repeating the insulating film forming process by a CVD method and a plasma modifying process plural times, after the plasma oxidation process.

Figure 16A:
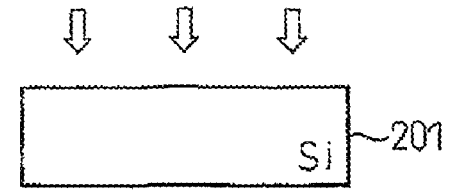
FIG. 16A-16H are schematic diagrams illustrating primary steps of the method of forming an insulating film according to the second exemplary embodiment of the present invention.
Figure 16B:
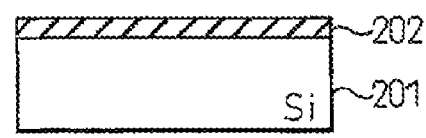

First, at step S11, wafer W that is an object to be processed is carried into plasma processing apparatus 100 (process module 101a) by transfer apparatus 109 in vacuum-side transfer chamber 103, as described above. Next, at step S12, the plasma oxidization process is performed for silicon layer 201 exposed on a surface of wafer W as shown in FIG. 16A. As shown in FIG. 16A, the surface of silicon layer 201 is oxidized by the plasma oxidization process to form silicon oxide film 202 with a predetermined film thickness as a first insulating film. Since the processes of above steps S11 and S12 are the same as the processes of steps S1 and S2 in the first exemplary embodiment (refer to FIG. 6), detailed descriptions thereof are omitted.

Next, at step S13, transfer apparatus 109 in vacuum-side transfer chamber 103 transfers wafer W formed with the silicon oxide film thereon to single wafer CVD film forming apparatuses 300 (process module 101b or 101c). Here, transfer apparatus 109 in vacuum-side transfer chamber 103 transfers wafer W in the vacuum state.

Figure 16C:
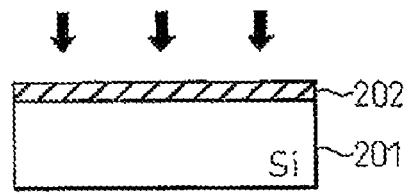
Figure 16D:
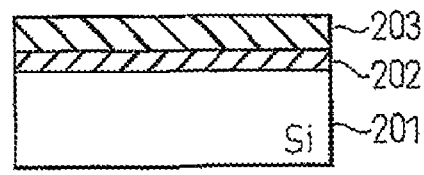

Next, at step S14, a film forming process is performed by the CVD method on silicon oxide layer 202 formed on the surface of wafer W, as shown in FIG. 16C. Accordingly, silicon oxide film 203 is formed as a second insulating film on the silicon oxide film 202, as shown in FIG. 16D. Although the CVD method is used in the present embodiment utilizing substrate processing system 200, different CVD methods may be used such as, for example, a thermal CVD method, a decompression CVD method, a normal pressure CVD method or the like for forming a film.

Figure 16E:
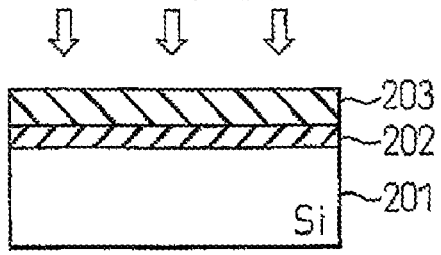
Figure 16F:
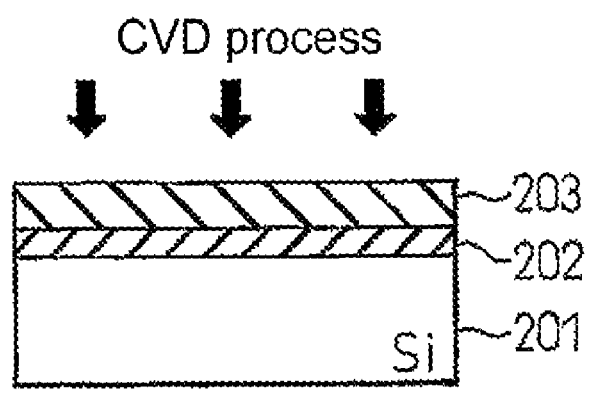
Figure 16G:
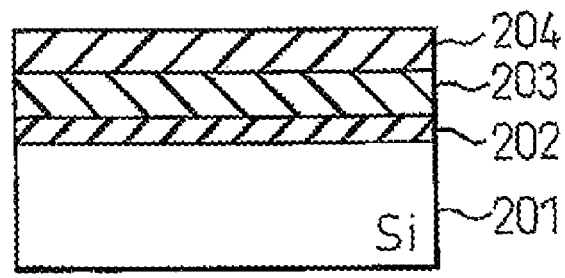
Figure 16H:
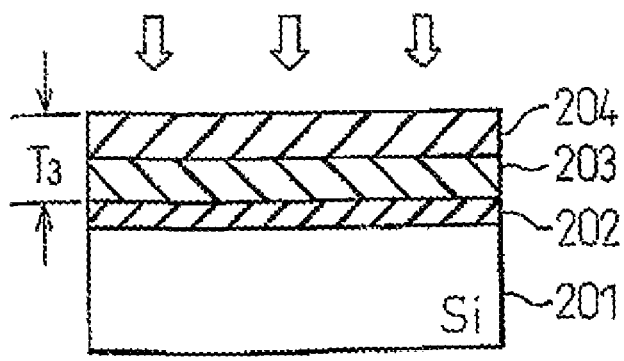

Next, at step S15, wafer W formed with silicon oxide films 202 and 203 thereon is transferred to plasma processing apparatus 100 (process module 101d) as the plasma modifying processing apparatus. Here, transfer apparatus 109 in vacuum-side transfer chamber 103 transfers wafer W in the vacuum state. Next, at step S16, the plasma modifying process is performed for silicon oxide film 203, as shown in FIG. 16E. In the present embodiment, the processes of steps S13 through S16 are repeated multiple times as needed. That is, silicon oxide film 204 functioning as the second insulating film is further stacked on silicon oxide film 203 functioning as the second insulating film using the CVD method, as shown in FIGS. 16F and 16G, and then the plasma modifying process is performed for silicon oxide film 204 of the highest layer, as shown in FIG. 16H. The processes of steps S13 through S16 are repeated until a total film thickness T$_3$ of the second insulating film (silicon oxide film 203, . . . ) reaches at a predetermined thickness ('Yes' at step S17). Since the processes of the above steps S13 through S16 are the same as the processes of steps S3 through S6 in the first exemplary embodiment (refer to FIG. 6), detailed descriptions thereof are omitted.

As explained above, after the processes of steps S13 through S16 are repeated, processed wafer W is carried out of plasma processing apparatuses 100 (process module 101d) by transfer apparatus 109 in vacuum-side transfer chamber 103 at step S18 and stored in wafer cassette CR of load port LP according to the procedures described above.

The method for forming an insulating film according to the present embodiment can form an insulating film (a silicon oxide film) having dense and good film quality with a desired film thickness $T_3$ by repeating steps S13 through S16. Although a thick silicon oxide film with a film thickness range of 10 nm and 1000 nm can be formed by just one time of the CVD process, it is hard to modify the silicon oxide film to have dense and good film quality in that state. The reason is that the thickness (a depth from the surface) of the silicon oxide film that can be modified with plasma has a limit, since the penetration capacity of $O_2^+$ ions and $O(^1D_2)$ radicals to the silicon oxide film that is an object to be processed is low. Accordingly, the method for forming an insulating film according to the present embodiment can form an insulating film having dense and good film quality with a desired film thickness $T_3$ by repeating the deposition of a silicon oxide film using the CVD method and the plasma modifying process.

Also, it is preferable that the plasma oxidation process is performed for the silicon underlying layer at step S12 prior to the multiple times of the film forming process using the CVD method, and the interface between silicon and a silicon oxide film can be flatten. As a result, the present embodiment can suppress the increase of the interface-level density caused by the accumulation of fixed charges and can secure the mobility of carriers to improve the electrical characteristics of devices.

Other constitutions, actions and effects of the present embodiment are the same as those of the first exemplary embodiment. Also, each of process modules 101a and 101d may be configured to perform both the plasma oxidation process of step S12 and the plasma modifying process of step S16, respectively.

Figure 17:
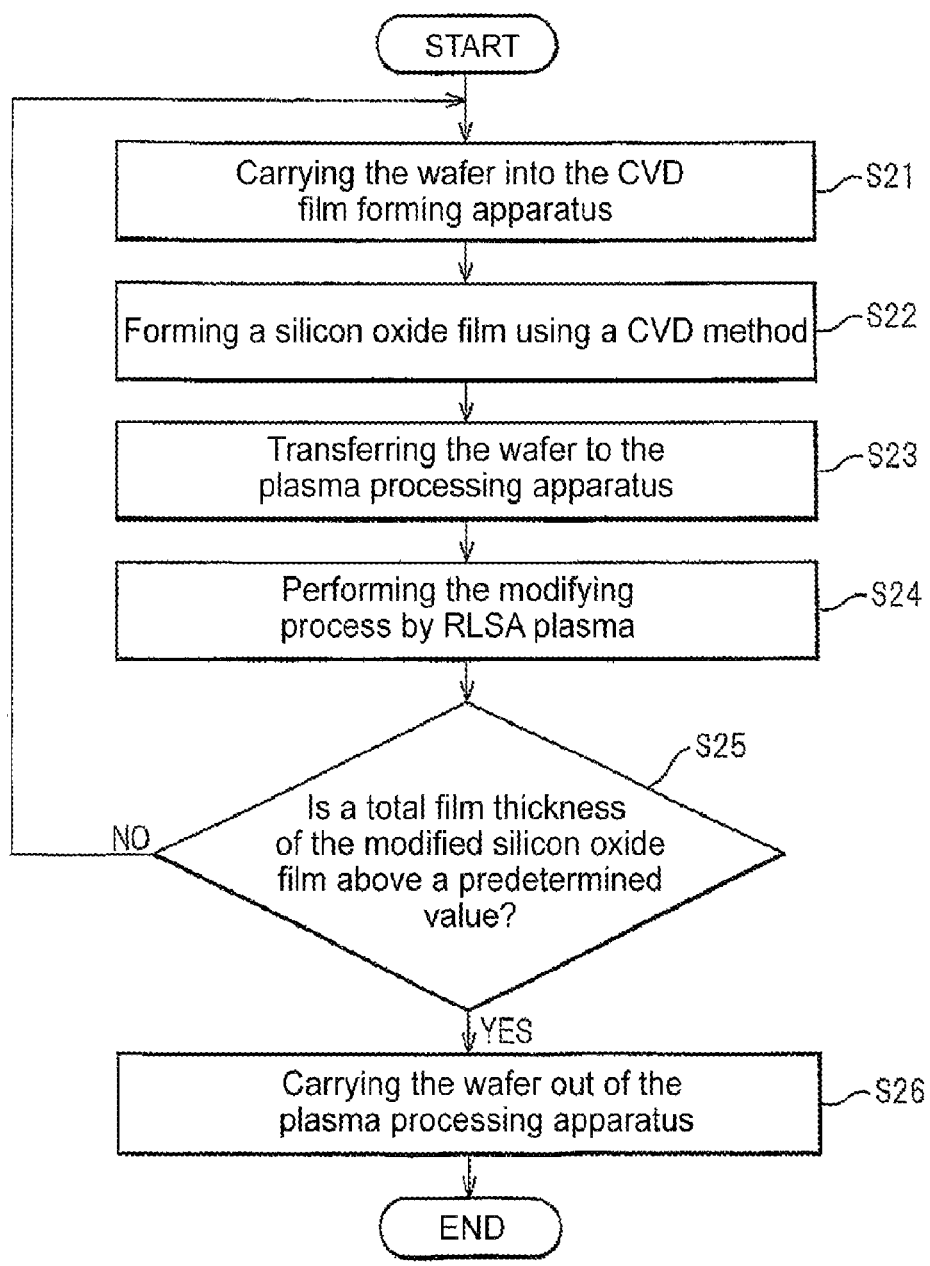
FIG. 17 is a flowchart illustrating steps of a method for forming an insulating film according to a third exemplary embodiment of the present invention.

Next, referring to FIG. 17 and FIGS. 18A through 18G, a third exemplary embodiment of the present invention will be described. A characteristic of the third exemplary embodiment is to form a thick film of silicon oxide without oxidizing the silicon layer of wafer W, unlike the first and second exemplary embodiments. FIG. 17 is a flowchart illustrating steps of a method for forming an silicon oxide film including the film forming step of a silicon oxide film as an insulating film and the modifying process step thereof, and FIGS. 18A through 18G show the primary steps thereof.

For example, the method for forming a silicon oxide film according to the present embodiment is performed by procedures of steps S21 through S26, as shown in FIG. 17. First, at step S21 of FIG. 17, wafer W that is an object to be processed is carried into CVD film forming apparatus 100 (process module 101a or 101c) by transfer apparatus 109 in vacuum-side transfer chamber 103.

Figure 18A:
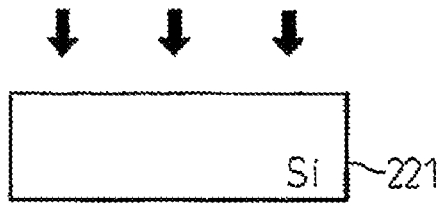
FIG. 18A-18G are schematic diagrams illustrating primary steps of the method of forming an insulating film according to the third exemplary embodiment of the present invention.
Figure 18B:

Next, at step S22, a film forming process using the CVD method is performed on silicon layer 221 exposed on the surface of wafer W, as shown in FIG. 18A. For this reason, a silicon oxide film 222 is formed on silicon layer 221 as an insulating film as shown FIG. 18B. A thermal CVD method is used as the CVD method in the present embodiment utilizing substrate processing system 200. However, different CVD methods such as a plasma CVD method, a decompression CVD method or a normal pressure CVD method may be used for forming the film. Also, a plasma CVD method is preferable from the viewpoint of thermal budget.

A film thickness $T_{11}$ of silicon oxide film 222 formed on silicon layer 221 of wafer W by the film forming process using the CVD method is preferably in the range of 2 nm and 10 nm, more preferably in the range of 4 nm and 8 nm, to obtain a sufficient modifying effect during the plasma modifying process that is performed later. When the film thickness $T_{11}$ of silicon oxide film 222 that is an object of the modifying process is below 2 nm, the repetition number until the film thickness reaches a desired film thickness increases, so it is inefficient. Meanwhile, when the film thickness $T_{11}$ of silicon oxide film 222 is above 10 nm, it becomes hard to modify the entire thickness direction sufficiently.

Figure 18C:
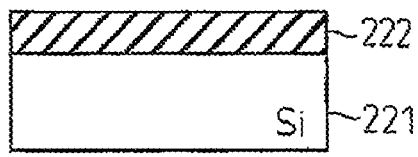
Figure 18D:

Next, at step S23, wafer W formed with silicon oxide film 222 thereon is transferred to plasma processing apparatuses 100 (process module 101b or 101c). Here, transfer apparatus 109 in vacuum-side transfer chamber 103 transfers wafer W in the vacuum state. Next, at step S24, the plasma modifying process is performed for silicon oxide film 222, as shown in FIG. 18C. Procedures and conditions of the plasma modifying process using plasma processing apparatus 100 are the same as described in the description of the first exemplary embodiment.

Silicon oxide film 222 formed by the CVD method can be improved to have practically good quality to the depth range of 2 nm and 10 nm, by modifying silicon oxide film 222 with plasma using plasma processing apparatus 100 on the above conditions. Accordingly, the film thickness $T_{11}$ of silicon oxide film 222 formed by just one time of a CVD process is preferably in the range of 2 nm and 10 nm as described above, and a processing time of the plasma modifying process is preferably in the range of 5 sec. and 600 sec. in that case. Although the plasma modifying process is performed for the silicon oxide film with the above film thickness during the processing time of less than 5 sec. on the above condition, the modifying may be insufficient. Meanwhile, although the plasma modifying process is performed during the processing time of more than 600 sec., it is not expected to enhance the modifying effect, so it is inefficient as well.

The above conditions are stored as recipes in storage unit 53 of control unit 50. And, process controller 51 reads out the recipes and transmits control signals to the respective components of plasma processing apparatus 100, such as gas supply unit 18, exhaust device 24, microwave generator 39, the heater power source 5a and so forth, thereby performing the plasma modifying process under a desired condition.

Figure 18E:
Figure 18F:
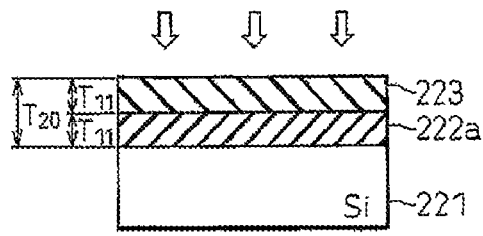
Figure 18G:
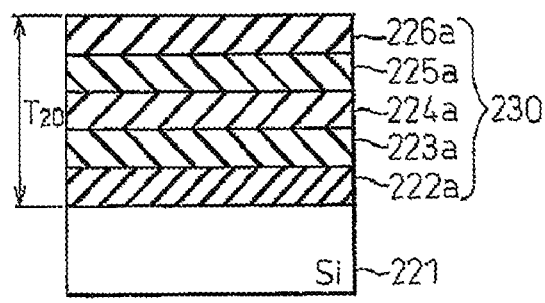

In the present embodiment, the processes of steps S22 and S23 may be repeated multiple times as needed, after the plasma modifying process in step S24 is finished. That is, at step S25, it is determined whether a total film thickness of modified silicon oxide 222 reaches at a predetermined film thickness, after the process of step S24 is finished. If the film thickness does not reach ('NO' of step S25), the process is returned to step S21 and wafer W is transferred to the CVD film forming apparatus (process module 101a or 101c) (refer to step S21). Then, an insulating film is deposited again on modified silicon oxide film 222a using the CVD method (refer to the step S22). As a result, a silicon oxide film 223 with a film thickness $T_{11}$ is stacked on modified silicon oxide film 222a, as shown in FIG. 18E.

Successively, wafer W is transferred to plasma processing apparatus 100 (process module 101b or 101d) (refer to the step S23), and the plasma modifying process is performed for the silicon oxide film of the highest layer (refer to step S24). The processes of steps S22 and S24 are repeated until the total film thickness $T_{20}$ which is equal to a film thickness $T_{11} \times$ the number of film forming) of stacked insulating film 230 (the modified silicon oxide film 222a, 223a, 224a, 225a, 226a, . . . ) reaches at a predetermined film thickness. The film thickness $T_{20}$ is preferably in the range of 4 nm and 1000 nm, more preferably in the range of 4 nm and 100 nm.

As explained above, if the processes of steps S22 and S24 are repeated to form stacked insulating film 230 with a predetermined film thickness, since it is determined as "Yes" in step S25, processed wafer W is carried out of plasma processing apparatus 100 (process module 101b or 101d) by transfer apparatus 109 in vacuum-side transfer chamber 103 and is stored in wafer cassette CR of load port LP according to the procedures as described above.

The method for forming an insulating film according to the present embodiment can form an insulating film (silicon oxide film 222, 223, . . . ) having substantially no defect, dense and good film quality with a desired film thickness $T_{20}$ by repeating steps S22 and S24. Although a thick silicon oxide film with a film thickness in the range of 10 nm and 1000 nm can be formed by just one time of the CVD process, it is hard to modify the entire silicon oxide film to be dense and have good film quality. The reason is that the thickness (a depth from the surface) of the silicon oxide film that can be modified with plasma has a limit since $O_2^+$ ions and $O(^1D_2)$ radicals, that are important active species for the plasma modifying process, have less ability to penetrate the silicon oxide film that is an object to be processed. The method for forming an insulating film according to the present embodiment can form an insulating film having dense and good film quality with any thickness $T_{20}$, and as thick as the prior film formed by the CVD method without being limited to the limit thickness for the modification by repeating the deposition of a silicon oxide film using a CVD method and a plasma modifying process.

Also, since substrate processing system 200 can perform deposition process of a silicon oxide film using the CVD method and a modifying process thereof successively and repeatedly, an insulating film having a good film quality compared to the prior film formed by the CVD method can be obtained with a film thickness as thick as the prior film, while obtaining the practically necessary throughput (for example, 30~60 wafers/hour).

Figure 19:
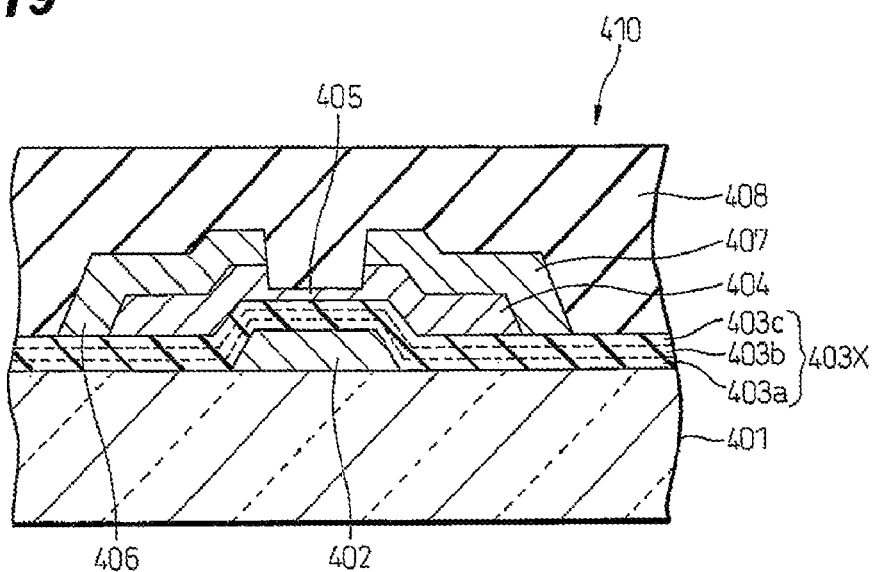
FIG. 19 is a schematic diagram illustrating a TFT device to which the method of forming an insulating film according to the third exemplary embodiment of the present invention can be applied.

FIG. 19 is a cross-sectional view illustrating a schematic constitution of a TFT device 410 to which the method for forming an insulating film according to the third exemplary embodiment can be applied. Also, since the same reference numerals as those of TFT device 400 shown in the FIG. 10 indicate same or similar constitutional element, an overlapping description about them will be omitted. TFT device 410 in the FIG. 19 is characterized in that gate insulating film 403 of TFT device 400 in FIG. 10 is formed as an insulating film 403X according the third exemplary embodiment.

When the method for forming an insulating film according to the present embodiment is applied to TFT device 410 having constitutions as shown in FIG. 19, metal material is formed and patterned on glass substrate 401 for a gate electrode 402. Next, a gate insulating film 403X is formed using the CVD method to cover the surface of gate electrode 402 and glass substrate 401. When forming gate insulating film 403X, the CVD step and the plasma modifying process step are repeated at a predetermined times. That is, a first silicon oxide film 403 is formed by a CVD method first, and successively, first silicon oxide film 403 is modified with plasma using plasma processing apparatus 100. Next, a second silicon oxide film 403b is formed on first silicon oxide film 403a by the CVD method, and then second silicon oxide film 403b is modified with plasma using plasma processing apparatus 100. Also, a third silicon oxide film 403c is formed on second silicon oxide film 403b by the CVD method, and then third silicon oxide film 403c is modified using plasma processing apparatus 100. The CVD method is preferably a plasma CVD from the viewpoint of thermal budget. Thus, dense gate insulating film 403X with less defect such as impurities, dangling bonds or the like can be formed at a low temperature process. Also, a silicon oxide film composing gate insulating film 403X is not limited to the three layers, and may be two layers or four and more layers, according to the thickness of gate insulating film 403X. The above process may be performed by the procedures of steps S21 through S26.

After that, TFT device 410 can be formed by repeating film forming and etching, forming and patterning of an a-Si film 404, forming and patterning of a source electrode 406 and a drain electrode 407, and forming and patterning of a passivation film 408 and an ITO electrode (not shown) according to the normal methods.

In TFT device 410 of FIG. 19, gate insulating film 403X can be formed with a desired film thickness by repeating the CVD process and the plasma modifying process. Further, the plasma modifying process can improve electrical performance of TFT device 410, since the plasma modifying process can make the film quality of the entire gate insulating film 403X to be dense and have a good quality with less defect such as impurities or dangling bonds.

Though the exemplary embodiments of the present invention are described above, the present invention is not limited to the above exemplary embodiments and various modifications can be made thereto. For example, in the exemplary embodiments, the silicon oxide film ($SiO_2$ film) formed with thermal CVD method is used as an insulating film for an object to be processed by the plasma modifying process. However, silicon oxide film formed by other CVD method such as the plasma CVD method may also be used for the plasma modifying process. In this case, as the film quality of the silicon oxide film gets worse (e.g., the film quality is more coarse), a higher modification effect can be obtained.

Further, the insulating film which is used as a target of the plasma modifying process is not limited to the silicon oxide film and the plasma modifying process is also applicable to a metal oxide film with high dielectric constant that contains the metal oxide such as zirconium, tantalum, titan, barium, strontium, aluminum, hafnium and so forth. In this case, since a flat interface may not be obtained by simply forming the high-dielectric metal oxide film on a silicon surface by the CVD method, the plasma oxidation process may effectively be performed prior to the film forming process to obtain a sufficiently flat interface. And, then the high-dielectric metal oxide film may be formed thereon.

What is claimed is:

1. A method for forming an insulating film comprising:
   oxidizing silicon exposed on a surface of a substrate with plasma of process gas containing noble gas and oxygen gas ($O_2$ to form a silicon oxide film as a first insulating film;
   forming a second insulating film on the silicon oxide film using a CVD process; and
   modifying the second insulating film using plasma of a process gas containing noble gas and oxygen gas, and
   wherein the oxidizing step uses plasma that has a relatively higher density of $O_2^\pm$ ion and $O(^1D_2)$ radical as oxidation active species, wherein the modifying step uses plasma that has a relatively higher density of $O_2^\pm$ ion and $O(^1D_2)$ radical as active species in plasma, wherein the oxidizing step is conducted with a plasma processing apparatus that introduces microwave to a process chamber with a plane antenna having a plurality of holes, and the plasma processing apparatus has a process pressure in the range of 6.7 Pa and 267 Pa, and the flow rate ratio of the oxygen gas over an entire process gas ranges from 0.1% to 30%, wherein the modifying step is conducted at a process pressure range of 6.7 Pa and 267 Pa, and the flow rate ratio of the oxygen gas over an entire process gas ranges from 0.1% to 30%, and wherein the modifying step is conducted by a plasma processing apparatus that introduces microwave to a process chamber with a plane antenna having a plurality of holes.

2. The method according to claim 1, wherein the interface between the silicon and the first insulating film formed in the oxidizing step has a flatness (RMS) in the range of 0.05 nm and 0.13 nm, and the first insulating film has a film thickness in the range of 3 nm and 10 nm.

3. The method according to claim 1, wherein the second insulating film formed by the CVD process has a film thickness in the range of 3 nm and 10 nm.

4. The method according to claim 1, wherein the process pressure in the oxidizing step ranges from 6.7 Pa to 67 Pa.

5. The method according to claim 1, wherein the process pressure of the modifying step ranges from 6.7 Pa to 67 Pa.

6. The method according to claim 1, wherein the second insulating film is formed by either a plasma CVD or a thermal CVD.

7. The method according to claim 1, wherein each of the forming step and the modifying step is repeatedly performed until a total thickness of the second insulating film reaches at a predetermined thickness.

8. The method according to claim 1, wherein the process temperature of the oxidizing step and the modifying step ranges from 200☐ to 600☐.

9. The method according to claim 1, wherein the oxidizing step and the modifying step are conducted in the same process chamber.

10. The method according to claim 1, wherein the second insulating film is a silicon oxide film deposited by a CVD process using dichloro-silane and $N_2O$ as raw material gases.

11. The method for forming an insulating film comprising:
forming an insulating film on a silicon exposed on a surface of a substrate, where the insulating film is formed by a CVD process with a film thickness in the range of 2 nm and 10 nm;
modifying the insulating film using a plasma processing apparatus that introduces microwave into a process chamber with a plane antenna having a plurality of holes, where the insulating film is processed with plasma of a process gas that contains noble gas and oxygen gas; and
repeating the forming step and the modifying step to form the insulating film, and wherein the modifying steps uses plasma that has a relatively higher density of $O_2^+$ and $O(^1D_2)$ radical as active species in plasma, wherein the modifying step is conducted by a plasma processing apparatus that introduces microwave to a process chamber with a plane antenna having a plurality of holes, and wherein the modifying step is conducted at a process pressure range of 6.7 Pa and 267 Pa and the flow rate ratio of the oxygen gas over an entire process gas ranges from 0.1% to 30%.

12. The method according to claim 11, wherein each of the forming step and the modifying step is repeated until a total thickness of the insulating film reaches within a range of 4 nm and 1000 nm.

13. A computer readable medium storing a control program that, when executed, causes a computer to perform a method for forming an insulating film using a process system having a plurality of process chambers for conducting a predetermined process for an object, the method comprising:
oxidizing silicon exposed on a surface of a substrate with plasma of process gas containing noble gas and oxygen gas ($O_2$) to form a silicon oxide film as a first insulating film; forming a second insulating film on the silicon oxide film by a CVD process; and modifying the second insulating film using plasma of a process gas containing noble gas and oxygen gas, and wherein the oxidizing step uses plasma that has a relatively higher density of $O_2^\pm$ ion and $O(^1D_2)$ radical as oxidation active species, wherein the modifying step uses plasma that has a relatively higher density of $O_2^+$ ion and $O(^1D_2)$ radical as active species in plasma, wherein the oxidizing step is conducted with a plasma processing apparatus that introduces microwave to a process chamber with a plane antenna having a plurality of holes, and the plasma processing apparatus has a process pressure in the range of 6.7 Pa and 267 Pa, and the flow rate ratio of the oxygen gas over an entire process gas ranges from 0.1% to 30%, wherein the modifying step is conducted at a process pressure range of 6.7 Pa and 267 Pa, and the flow rate ratio of the oxygen gas over an entire process gas ranges from 0.1% to 30%, and wherein the modifying step is conducted by a plasma processing apparatus that introduces microwave to a process chamber with a plane antenna having a plurality of holes.

14. A processing system having a plurality of process chambers each controlled by a control unit comprising:
a first process chamber configured to oxidize silicon exposed on a surface of an object with plasma of process gas containing noble gas and oxygen gas ($O_2$) to form a silicon oxide film as a first insulating film;
a second process chamber configured to form a second insulating film on the silicon oxide film using a CVD process; and a third process chamber configured to modify the second insulating film using plasma of a process gas containing noble gas and oxygen gas and, wherein the oxidizing step uses plasma that has a relatively higher density of $O_2^\pm$ ion and $O(^1D_2)$ radical as oxidation active species, wherein the modifying step uses plasma that has a relatively higher density of $O_2^\pm$ ion and $O(^1D_2)$ radical as active species in plasma, wherein the oxidizing step is conducted with a plasma processing apparatus that introduces microwave to a process chamber with a plane antenna having a plurality of holes, and the plasma processing apparatus has a process pressure in the range of 6.7 Pa and 267 Pa, and the flow rate ratio of the oxygen gas over an entire process gas ranges from 0.1% to 30%,
wherein the modifying step is conducted at a process pressure range of 6.7 Pa and 267 Pa, and the flow rate ratio of the oxygen gas over an entire process gas ranges from 0.1% to 30%, and
wherein the modifying step is conducted by a plasma processing apparatus that introduces microwave to a process chamber with a plane antenna having a plurality of holes.

15. The method according to claim 1, wherein the flow rate ratio of the oxygen gas over an entire process gas in the oxidizing step ranges from 0.5% to 3%.

16. The method according to claim 11, wherein the flow rate ratio of the oxygen gas over an entire process gas in the modifying step ranges from 0.1% to 5%.

17. The method according to claim 11, wherein the process pressure in the modifying step ranges from 6.7 Pa to 67 Pa.

* * * * *